US012745360B2

(12) United States Patent
Won et al.

(10) Patent No.: US 12,745,360 B2
(45) Date of Patent: Sep. 22, 2026

(54) MOUNTING BRACKET AND ELECTRONIC DEVICE AND DISPLAY APPARATUS INCLUDING THE SAME

(71) Applicant: SAMSUNG ELECTRONICS CO., LTD., Suwon-si (KR)

(72) Inventors: Junhyun Won, Suwon-si (KR); Jiwon Lee, Suwon-si (KR); Sungyong Joo, Suwon-si (KR); Taejun You, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 109 days.

(21) Appl. No.: 18/786,098

(22) Filed: Jul. 26, 2024

(65) Prior Publication Data

US 2024/0389257 A1 Nov. 21, 2024

Related U.S. Application Data

(63) Continuation of application No. PCT/KR2022/021015, filed on Dec. 22, 2022.

(30) Foreign Application Priority Data

Feb. 18, 2022 (KR) ........................ 10-2022-0021604

(51) Int. Cl.
*H05K 7/14* (2006.01)

(52) U.S. Cl.
CPC .................................. *H05K 7/1417* (2013.01)

(58) Field of Classification Search
CPC ...... G02F 1/13452; G06F 1/183; G06F 1/184; H05K 7/1417; H05K 9/0039; H05K 7/142; H05K 5/0018; H05K 7/1405
See application file for complete search history.

(56) References Cited

U.S. PATENT DOCUMENTS 6,424,537 B1 * 7/2002 Paquin .................. H05K 7/142 361/752
6,695,629 B1 * 2/2004 Mayer .................... H05K 7/142 361/752

(Continued)

FOREIGN PATENT DOCUMENTS

KR 10-2006-0112142 A 10/2006
KR 10-0796487 B1 1/2008

(Continued)

OTHER PUBLICATIONS

International Search Report (PCT/ISA/210) issued by the International Searching Authority on Apr. 20, 2023 in corresponding International Application No. PCT/KR2022/021015.

(Continued)

*Primary Examiner* — Sagar Shrestha
(74) *Attorney, Agent, or Firm* — Sughrue Mion, PLLC

(57) ABSTRACT

An electronic device includes: a printed circuit board on which an electronic component is mounted; a case comprising a board mounting portion, on which the printed circuit board is mounted, the board mounting portion comprising an interference wall; and a mounting member fixed to the printed circuit board and configured to fix the printed circuit board to the board mounting portion, the mounting member including an interference portion configured to interfere with the interference wall and a scratch protrusion protruding from the interference portion and configured to scratch an outer surface of the interference wall in a state in which to the interference portion interferes with the interference wall.

13 Claims, 18 Drawing Sheets

(56) References Cited

U.S. PATENT DOCUMENTS

| | | | | |
|---|---|---|---|---|
| 6,746,254 | B2 * | 6/2004 | Hooper | H05K 7/142 439/95 |
| 7,088,403 | B2 | 8/2006 | Kim | |
| 7,948,578 | B2 | 5/2011 | Ko et al. | |
| 8,059,227 | B2 | 11/2011 | Shin | |
| 9,239,482 | B2 | 1/2016 | Li | |
| 10,709,026 | B2 | 7/2020 | Kim et al. | |
| 10,738,813 | B2 | 8/2020 | Jung et al. | |
| 11,224,135 | B2 | 1/2022 | Song et al. | |
| 2004/0095733 | A1 * | 5/2004 | Cheng | G06F 1/184 361/759 |
| 2007/0195219 | A1 * | 8/2007 | Moon | H04N 5/64 348/E5.128 |
| 2011/0265860 | A1 | 11/2011 | Ciasulli et al. | |
| 2011/0273339 | A1 * | 11/2011 | Hornung | H01R 9/0515 343/702 |
| 2011/0317376 | A1 * | 12/2011 | Chen | G06F 1/185 361/752 |
| 2017/0164487 | A1 * | 6/2017 | Kim | G06F 1/1601 |
| 2021/0382336 | A1 * | 12/2021 | Lee | G02F 1/133602 |

FOREIGN PATENT DOCUMENTS

| | | | |
|---|---|---|---|
| KR | 10-2008-0056880 | A | 6/2008 |
| KR | 10-2011-0047465 | A | 5/2011 |
| KR | 10-1388584 | B1 | 4/2014 |
| KR | 10-1419374 | B1 | 7/2014 |
| KR | 10-1530129 | B1 | 6/2015 |
| KR | 10-1732518 | B1 | 5/2017 |
| KR | 10-2017-0065786 | A | 6/2017 |
| KR | 10-2017-0065788 | A | 6/2017 |
| KR | 10-1778899 | B1 | 9/2017 |
| KR | 10-2020-0064503 | A | 6/2020 |
| KR | 10-2021-0085386 | A | 7/2021 |

OTHER PUBLICATIONS

Communication dated Sep. 19, 2025 issued by the Korean Intellectual Property Office in Korean Patent Application No. 10-2022-0021604.

Communication dated Jul. 23, 2026, issued by the Korean Ministry of Intellectual Property in Korean Application No. 10-2022-0021604.

* cited by examiner

MOUNTING BRACKET AND ELECTRONIC DEVICE AND DISPLAY APPARATUS INCLUDING THE SAME

CROSS-REFERENCE TO RELATED APPLICATIONS

This application is a continuation of International Application No. PCT/KR2022/021015, filed on Dec. 22, 2022, which is based on and claims priority to Korean Patent Application No. 10-2022-0021604, filed on Feb. 18, 2022, in the Korean Intellectual Property Office, the disclosures of which are incorporated by reference herein in their entireties.

BACKGROUND

1. Field

The present disclosure relates to an electronic device and a display apparatus, and more particularly, to an electronic device and a display apparatus configured to mount a printed circuit board to a case.

2. Description of the Related Art

An electronic device generally includes an electronic component and a printed circuit board (PCB) on which the electronic component is mounted, and refers to various types of devices that are configured to perform specific functions by receiving power.

A printed circuit board is formed by printing a circuit line pattern with a conductive material such as copper on an electrical insulating board, and refers to a board on which an electronic component is mountable.

Generally, in the process of mounting components of an electronic device, a fastening method using a screw or the like may be used. For example, a printed circuit board of an electronic device may be coupled to a case of the electronic device using screws. When components of an electronic device are installed using screws, manufacturing costs may increase because a separate fastening tool is required for screw fastening, and manufacturing time may increase because time is required for the screw fastening.

SUMMARY

Additional aspects will be set forth in part in the description which follows and, in part, will be apparent from the description, or may be learned by practice of the presented embodiments.

Provided is an electronic device including an improved structure capable of easily mounting a printed circuit board to a case of the electronic device.

Further provided is an electronic device including an improved structure for grounding a printed circuit board when the printed circuit board is mounted on the electronic device.

According to an aspect of the disclosure, an electronic device may include: a printed circuit board on which an electronic component is mounted; a case including a board mounting portion, on which the printed circuit board is mounted, the board mounting portion including an interference wall; and a mounting member fixed to the printed circuit board and configured to fix the printed circuit board to the board mounting portion, the mounting member including an interference portion configured to interfere with the interference wall and a scratch protrusion protruding from the interference portion and configured to scratch an outer surface of the interference wall in a state in which to the interference portion interferes with the interference wall.

The interference wall may include a coating layer on the outer surface of the interference wall, and the scratch protrusion may be configured to penetrate the coating layer.

The scratch protrusion may be configured to remove at least a portion of the coating layer may be removed in a state in which the interference portion interferes with the interference wall.

The interference wall may further include a conductive layer covered by the coating layer, and the scratch protrusion may be configured to contact the conductive layer.

The board mounting portion may include an insertion hole into which the interference portion and the scratch protrusion are inserted, and the scratch protrusion may be configured to be inserted into the insertion hole and contact with the interference wall.

The insertion hole may be open in a direction parallel to a direction in which the printed circuit board extends, and the scratch protrusion may be configured to be inserted into the insertion hole in the direction parallel to the direction in which the printed circuit board extends.

The interference portion may include a first extension portion extending toward the interference wall, a bending portion bent at one end of the first extension portion facing the interference wall, and a second extension portion extending from the bending portion, and the scratch protrusion may be at the bending portion.

The second extension portion may extend from the bending portion away from the interference wall.

The mounting member may include a mounting body mounted on one surface of the printed circuit board, and a fixing portion extending from the mounting body and configured to couple the mounting member to the printed circuit board, and the interference portion may extend from the mounting body and may be configured to penetrate the printed circuit board.

The interference wall may be parallel to the mounting body, and a distance between the scratch protrusion and the mounting body in a state in which the interference portion does not interfere with the interference wall may be less than a distance between the scratch protrusion and the mounting body in in a state in which to the interference portion interferes with the interference wall.

The interference portion may include a through-hole facing the interference wall, and the scratch protrusion may have a circumference corresponding to a circumference of the through-hole.

An inner surface of the scratch protrusion may be formed integrally with an outer circumference of the through-hole.

The scratch protrusion may be formed to protrude in a pressing direction of the interference portion when the through-hole is pressed in the interference portion.

The interference portion may include an elastic material.

The board mounting portion and the mounting member may each include a conductive material.

According to an aspect of the disclosure, a mounting bracket according to an embodiment of the present disclosure, which is provided to mount a printed circuit board, on which an electronic component is mounted, to a case including an interference wall, may include a bracket body provided to be seated on one surface of the printed circuit board; a fixing pin provided to extend from the bracket body and provided to be fixed to the printed circuit board; an interference portion provided to allow the mounting bracket to be coupled to the case by interfering with the interference wall; and a scratch protrusion provided to protrude from the interference portion to scratch an outer surface of the interference wall in response to the interference portion interfering with the interference wall.

The interference wall may include a coating layer applied to an outer surface of the interference wall, and the scratch protrusion may be in contact with an inner side of the coating layer of the interference wall in response to the interference portion interfering with the interference wall.

The interference portion may be provided to interfere with the interference wall while sliding in a direction parallel to a direction in which the printed circuit board extends, so as to allow the printed circuit board to be mounted on the case, and while the scratch protrusion slides with respect to the interference wall, at least a portion of the coating layer may be removed.

According to an aspect of the disclosure, a display apparatus according to an embodiment of the present disclosure may include a display panel provided to display an image forward; a bottom chassis disposed at a rear side of the display panel and including a board mounting portion; a printed circuit board on which an electronic component is mounted, the printed circuit board supported by the bottom chassis; and a mounting member provided to removably mount the printed circuit board to the board mounting portion, the mounting member including a fixing portion fixed to the printed circuit board, an interference portion provide to interfere with the board mounting portion to allow the mounting member to be coupled to the bottom chassis, and a scratch protrusion provided to scratch an outer surface of the board mounting portion in response to the interference portion interfering with the board mounting portion.

The printed circuit board may be disposed at a rear side of the bottom chassis, and the scratch protrusion may protrude from a front side to the rear side of the bottom chassis.

An electronic device may easily mount a printed circuit board to a case using a mounting member including an interference portion configured to interfere with the case.

Further, an electronic device may improve grounding a printed circuit board to a case by including a scratch protrusion.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
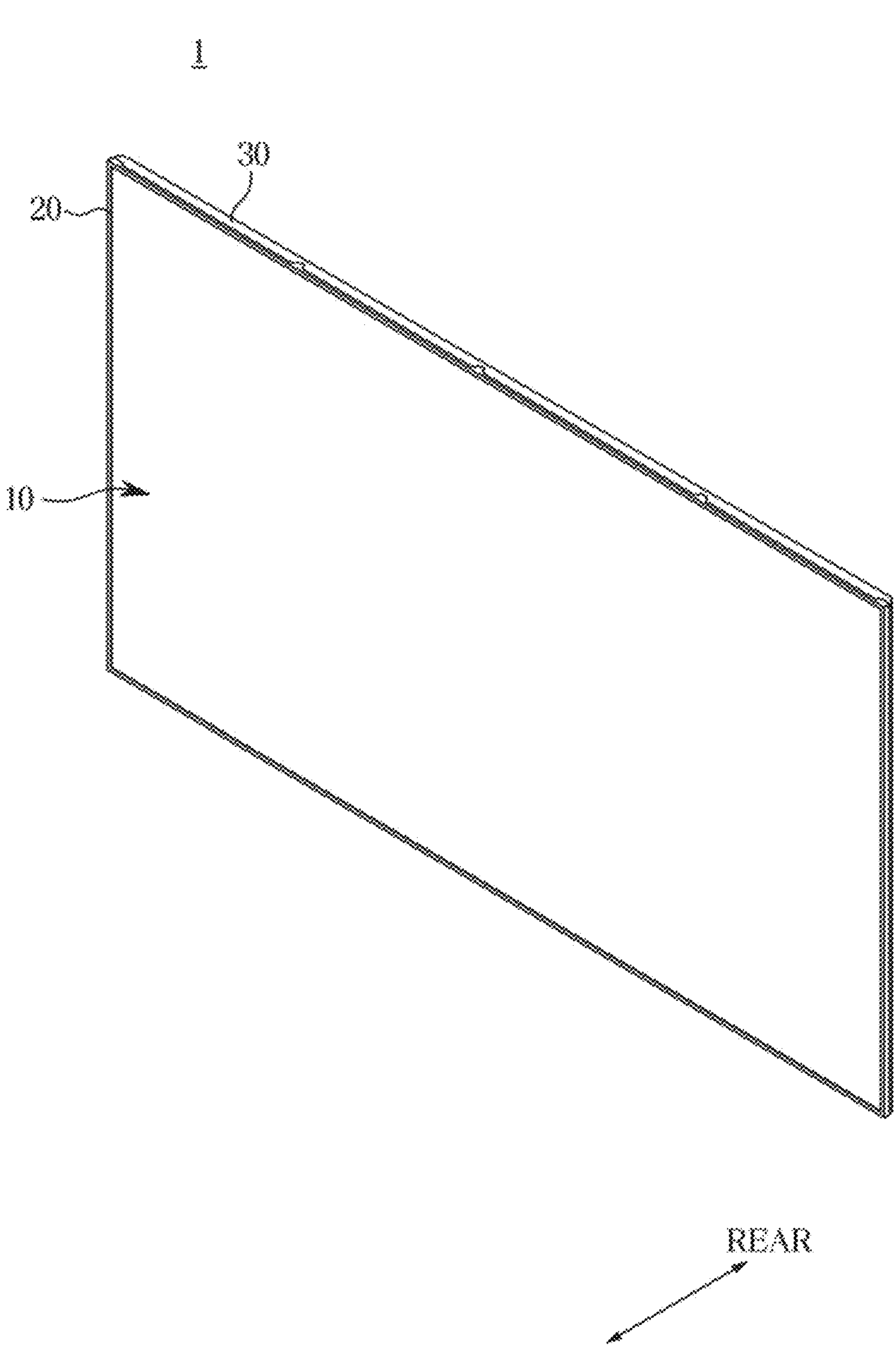
FIG. 1 is a perspective view illustrating an electronic device according to some embodiments of the present disclosure.

Embodiments described in the disclosure and configurations shown in the drawings are merely examples of the embodiments of the disclosure, and may be modified in various different ways at the time of filing of the present application to replace the embodiments and drawings of the disclosure.

In addition, the same reference numerals or signs shown in the drawings of the disclosure indicate elements or components performing substantially the same function.

Also, the terms used herein are used to describe the embodiments and are not intended to limit and/or restrict the disclosure. The singular forms "a," "an" and "the" are intended to include the plural forms as well, unless the context clearly indicates otherwise. In this disclosure, the terms "including", "having", and the like are used to specify features, numbers, steps, operations, elements, components, or combinations thereof, but do not preclude the presence or addition of one or more of the features, elements, steps, operations, elements, components, or combinations thereof.

It will be understood that, although the terms first, second, third, etc., may be used herein to describe various elements, but elements are not limited by these terms. These terms are only used to distinguish one element from another element. For example, without departing from the scope of the disclosure, a first element may be termed as a second element, and a second element may be termed as a first element. The term of "at least one of A, B, or C", "at least one of A, B, and C", and "and/or" includes a plurality of combinations of relevant items or any one item among a plurality of relevant items. For example, "at least one of A, B, or C" may include any and all of the combinations of A, B, and C, including A alone, B alone, C alone, only A and B, only A and C, only B and C, and all of A, B, and C.

In addition, the following description is based on a display apparatus as an example of the present disclosure, but is not limited thereto. The present disclosure is applicable not only to a display apparatus but also to various electronic devices to which a printed circuit board is applied. Particularly, the present disclosure may be applied to various types of electronic devices as long as the electronic device includes a printed circuit board to which an electronic component is mounted, and a case provided to support the printed circuit board.

Hereinafter exemplary embodiments of the present disclosure will be described in detail with reference to the accompanying drawings.

Figure 2:
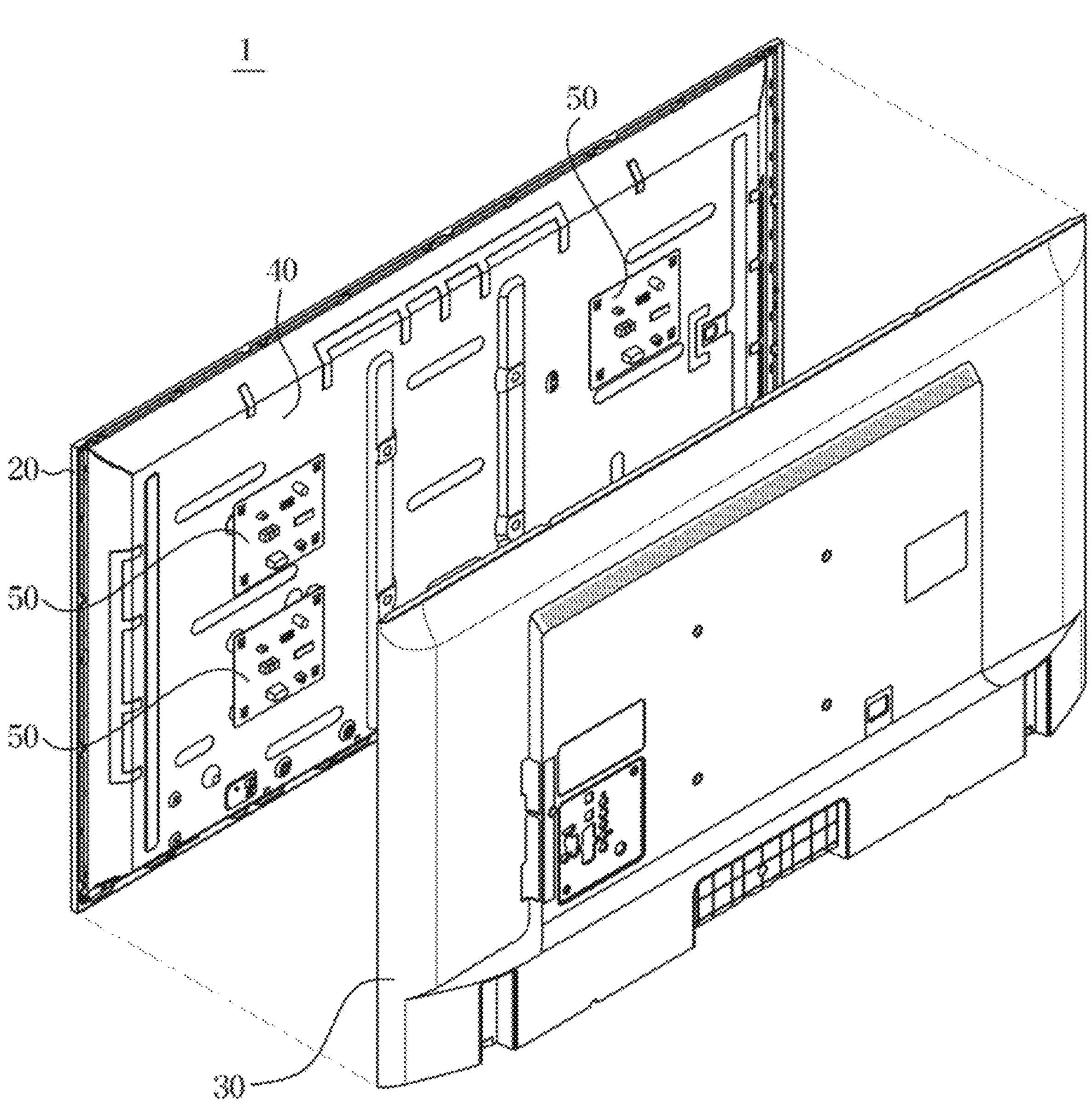
FIG. 2 is a view illustrating a state in which a rear cover is separated from a bottom chassis in the electronic device of FIG. 1.

FIG. 1 is a perspective view illustrating an electronic device some embodiments of the present disclosure. FIG. 2 is a view illustrating a state in which a rear cover is separated from a bottom chassis in the electronic device of FIG. 1

Referring to FIGS. 1 and 2, an electronic device 1 may be a display apparatus 1. The display apparatus 1 is a device that processes an image signal received from an outside and visually displays the processed image. FIGS. 1 and 2 illustrate that the display apparatus 1 is a television, but the present disclosure is not limited thereto. For example, the display apparatus 1 may be implemented in various forms, such as a monitor, a portable multimedia device, and a portable communication device, and the display apparatus 1 is not limited in the type thereof as long as the display apparatus is configured to visually display an image.

The display apparatus 1 may be a large format display (LFD) installed outdoors, such as a roof of a building or a bus stop. The outdoor is not limited to the outside of a building, and thus the display apparatus 1 according to some embodiments may be installed in any places as long as the display apparatus is accessed by a large number of people, even indoors, such as subway stations, shopping malls, movie theaters, companies, and stores.

The display apparatus 1 may receive content data including video signals and audio signals from various content sources and output video and audio corresponding to the video signals and the audio signals. For example, the display apparatus 1 may receive content data through a broadcast reception antenna or cable, receive content data from a content playback device, or receive content data from a content providing server of a content provider.

The display apparatus 1 may be configured to display a screen. Particularly, the display apparatus 1 may include a display panel 10 provided to display an image on a front portion thereof.

A plurality of pixels may be formed on the display panel 10. A screen displayed on a screen display area may be formed by combining light emitted from the plurality of pixels. For example, a single screen may be formed by combining light emitted from the plurality of pixels like a mosaic.

Each of the plurality of pixels may emit different brightness and different color of light. Particularly, the plurality of pixels may include sub-pixels, respectively, and the sub-pixels may include a red sub pixel emitting red light, a green sub pixel emitting green light, and a blue sub pixel emitting blue light. By combining the red light of the red sub pixel, the green light of the green sub pixel and the blue light of the blue sub pixel, each of the plurality of pixels may emit different brightness and different color of light.

The display module 10 may include a self-luminous display panel such as Organic Light-Emitting Diode (OLED) and a non-self-luminous display panel such as a liquid crystal display (LCD). There is no particular limitation on the type of display panel 10, and the display apparatus 1 may include various types of display panels 10.

When the display panel 10 is an LCD panel, the display panel 10 may include a Thin Film Transistor (TFT) substrate, in which thin film transistors (TFTs) are formed in a matrix form, a color filter substrate coupled in parallel with the TFT substrate, and a liquid crystal that is injected between the TFT substrate and the color filter substrate and has optical properties that vary depending on changes in voltage or temperature. Further, a back light unit (BLU) may be disposed at the rear side of the display panel 10. At the rear side of the display panel 10, the backlight unit may be configured to emit light toward the display panel 10. In this case, the display panel 10 may block or pass light emitted from the backlight unit. However, the present disclosure is not limited thereto. Alternatively, the display panel 10 may be the self-luminous display panel such as the OLED panel.

A cable configured to transmit image data to the display panel 10, and a display driver integrated circuit (DDI) configured to process digital image data and output an analog image signal may be provided at one side of the display panel 10.

The display apparatus 1 may include chassis 20, 30, and 40 provided to support the display panel 10. The chassis 20, 30, and 40 may support front, side, and rear surfaces of the display panel 10.

The display apparatus 1 may include a top chassis 20 provided to support a front surface or side surfaces of the display panel 10. The top chassis 20 may support the front surface of the display panel 10 by forming a bezel that is disposed to face the front side of the display apparatus 1. However, when the display apparatus 1 is a bezel-less type display apparatus with a very narrow or no bezel, the top chassis 20 may be provided to support only the side surface of the display panel 10. Alternatively, when a bottom chassis 40 supports the side surface of the display panel 10, the display apparatus 1 may not include the top chassis 20.

The display apparatus 1 may include the bottom chassis 40 disposed at the rear side of the display panel 10. The bottom chassis 40 may cover the rear side of the display panel 10, and support an optical sheet, the backlight unit, and a printed circuit board 50. When the display apparatus 1 includes the top chassis 20, the bottom chassis 40 may be coupled to the rear portion of the top chassis 20.

The display apparatus 1 may include a rear cover 30 provided to form a rear surface of the display apparatus 1. The rear cover 30 may be disposed at the rear side of the bottom chassis 40 and cover the bottom chassis 40 and the printed circuit board 50 that is mounted on the rear side of the bottom chassis 40.

The bottom chassis 40 of the display apparatus 1 may be referred to as a case 40. Further, the entire component supporting the display panel 10, including the top chassis 20 and the rear cover 30 as well as the bottom chassis 40, may be referred to as the case 40.

The case 40 may form an appearance of the display apparatus 1, and various components, including the printed circuit board 50, for the display apparatus 1 to display an image or to perform various functions may be disposed in the case 40. FIGS. 1 and 2 illustrate that the case 40 has a flat plate shape, but is not limited thereto. Alternatively, the case 40 may have a curved plate shape to correspond to the shape of the display panel 10. Alternatively, the case 40 may be provided in such a way that a flat state and a curved state are variable, and thus the case 40 may be applied to a bendable or a flexible display apparatus 1.

However, the electronic device 1 according to the present disclosure is not limited to the display apparatus 1 and may include various types of electronic devices. For example, the electronic device 1 may include a computer body including a central processing unit (CPU) of a personal computer (PC).

Hereinafter various types of electronic devices 1 including the display apparatus 1 will be described.

Figure 3:
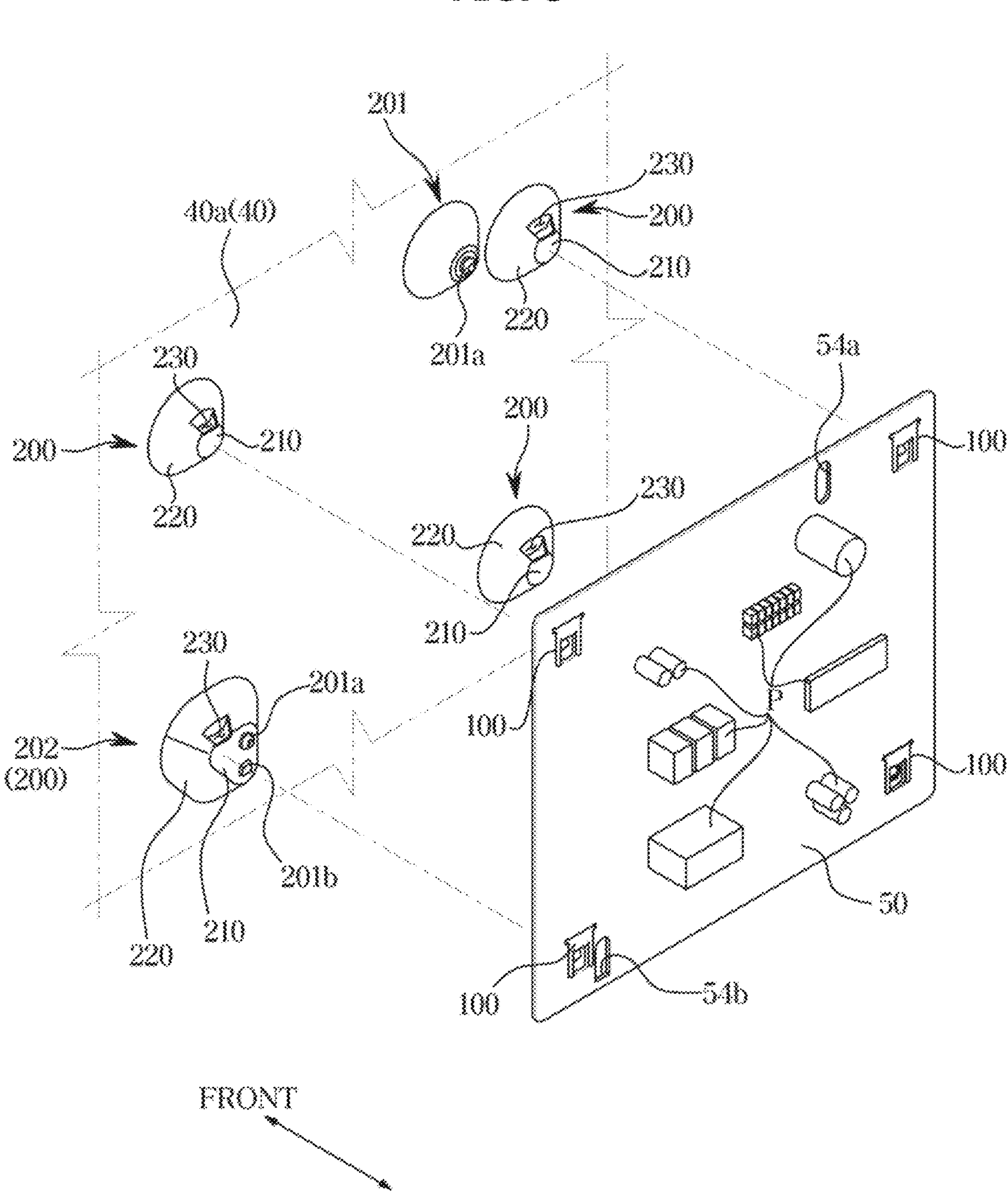
FIG. 3 is a view illustrating a coupling relationship between a printed circuit board and a case of the electronic device according to some embodiments of the present disclosure.
Figure 4:
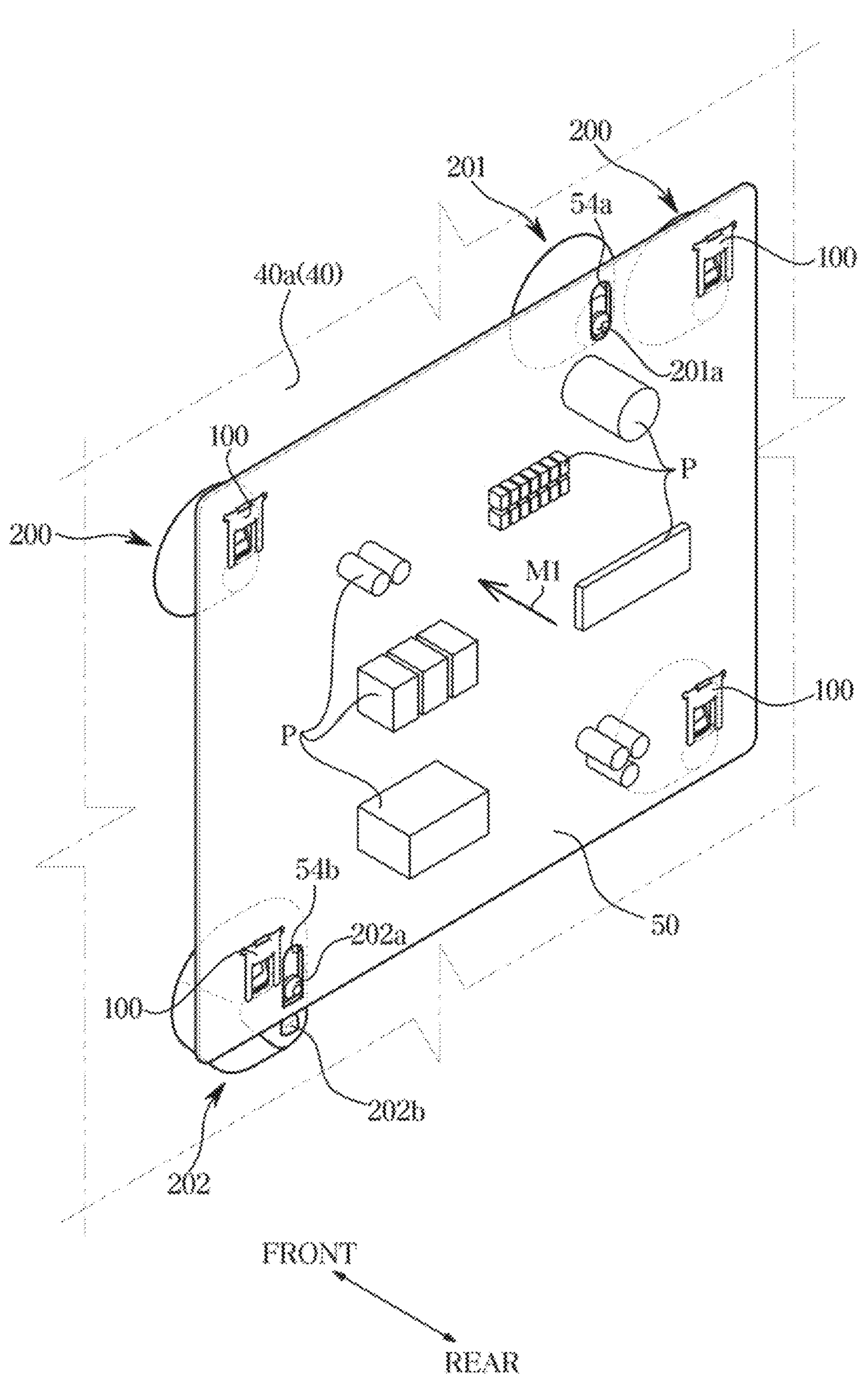
FIGS. 4 and 5 are views illustrating a process of coupling the printed circuit board of FIG. 3 to the case according to some embodiments of the present disclosure.
Figure 5:
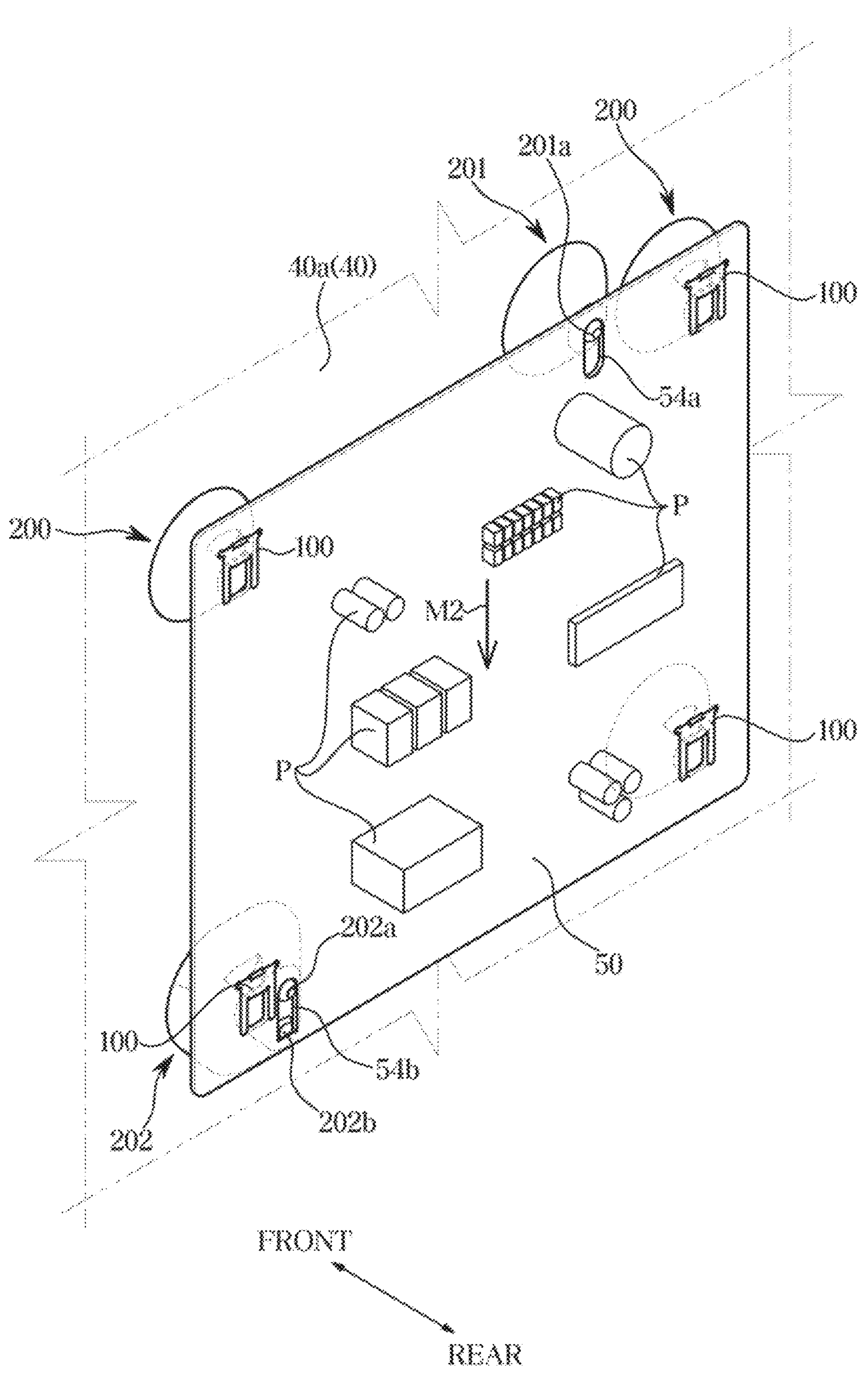

FIG. 3 is a view illustrating a coupling relationship between a printed circuit board and a case of the electronic device according to some embodiments of the present disclosure. FIGS. 4 and 5 are views illustrating a process of coupling the printed circuit board of FIG. 3 to the case.

Referring to FIGS. 3 to 5, the electronic device 1 may include the printed circuit board 50 on which electronic components P are mounted. The printed circuit board 50 is formed by printing a circuit line pattern with a conductive material such as copper on an electrical insulating board, and may refer to a board on which electronic components are mountable.

The electronic device 1 may include various types of printed circuit boards 50. The printed circuit board 50 may include a main board, a switched mode power supply (SMPS) board, a source board, etc.

The main board may include a processor and a power management unit for driving the electronic device 1. The SMPS board may supply power to drive the electronic device 1. When the electronic device 1 is a display apparatus, the source board may control the display panel 10.

The main board, the SMPS board, and the source board may be disposed independently of each other or merged with each other. The circuit boards arranged independently of each other may be connected to each other to exchange data, signals, or power.

As illustrated in FIG. 2, a plurality of printed circuit boards 50 may be provided in a single electronic device 1. However, the number of printed circuit boards 50 provided in the electronic device 1 is not limited to that shown in FIG. 2. Alternatively, a single printed circuit board 50 may be provided in a single electronic device 1.

The electronic device 1 may include the case 40 on which the printed circuit board 50 is mounted. The printed circuit board 50 may be mounted on the case 40 by a mounting member 100.

The case 40 may include a board mounting portion 200 on which the printed circuit board 50 is mounted. The board mounting portion 200 may be provided to face one surface of the printed circuit board 50 in the case 40. The board mounting portion 200 may be disposed on one surface of the case 40 facing the printed circuit board 50.

The board mounting portion 200 may have a shape that protrudes toward the printed circuit board 50. Particularly, the case 40 may include a board separation surface **40*a* formed to face one surface, which is on the side of the board mounting portion 200, of the printed circuit board 50 when the printed circuit board 50 is seated in the case 40. Further, the board mounting portion 200 may have a shape that protrudes from the board separation surface 40*a*. For example, as shown in FIG. 2, the board separation surface 40*a* may be provided at the rear surface of the bottom chassis 40 and may face the printed circuit board 50 disposed at the rear side of the bottom chassis 40. The board mounting portion 200 may be formed to protrude rearward from the bottom chassis 40. However, the arrangement of the board mounting portion 200 and the printed circuit board 50** is not limited thereto.

Because the board mounting portion 200 has a shape that protrudes from the board separation surface **40*a*, the printed circuit board 50 may be mounted on the case 40 while being spaced apart from the board separation surface 40*a***.

The case 40 may be formed to include a flat plate shape. Particularly, the board separation surface **40*a* facing the printed circuit board 50 of the case 40 may be formed to have a flat plate shape. However, the present disclosure is not limited thereto, and the board separation surface 40*a* and the case 40 including the same may be formed to include various shapes on which the printed circuit board 50** is mountable.

The board separation surface **40*a* and the board mounting portion 200 may be formed integrally with each other. Particularly, the board mounting portion 200 may be manufactured by pressing a portion of the flat plate-shaped case 40. However, the present disclosure is not limited thereto, and the board mounting portion 200 may be formed in various ways. Alternatively, the board separation surface 40*a* and the board mounting portion 200** may be manufactured separately and then coupled to each other.

The board mounting portion 200 may include a seating surface 210 on which the printed circuit board 50 is seated. The seating surface 210 may be formed in parallel with the printed circuit board 50 and may be arranged to face a board through-hole 51 (refer to FIG. 6) formed in the printed circuit board 50. The seating surface 210 may be formed at one end of the board mounting portion 200 with respect to a direction of protruding from the board separation surface **40*a***.

The seating surface 210 may be provided on the other side opposite to one side of an interference wall 240 (refer to FIG. 11) that interferes with an interference portion 130 (refer to FIG. 6), which will be described later.

The board mounting portion 200 may include an inclined surface 220 connecting the seating surface 210 and the board separation surface **40*a*. The inclined surface 220 may have an inclination formed to allow an area of a cross-section, which is cut in a direction parallel to the board separation surface 40*a*, of the board mounting portion 200 to be reduced from the board separation surface 40*a* toward the seating surface 210. That is, the board mounting portion 200** may be formed to have the overall shape of a horn.

The board mounting portion 200 may include an insertion hole 230 formed to allow at least a portion of the mounting member 100, which is coupled to the printed circuit board 50, to be inserted thereinto. The board mounting portion 200 may include a cavity formed inside the insertion hole 230 to accommodate at least a portion of the mounting member 100 inserted through the insertion hole 230. In other words, the board mounting portion 200 may include a concave space formed on a side opposite to the side on which the printed circuit board 50 is mounted, and at least a portion of the mounting member 100 may be inserted through the insertion hole 230 and accommodated in the concave space of the board mounting portion 200.

The insertion hole 230 may be formed to allow the interference portion 130 (refer to FIG. 6), which will be described later, to be inserted thereinto, and thus the printed circuit board 50 may be mounted on the board mounting portion 200 in a sliding manner by using the mounting member 100.

The insertion hole 230 may be formed to be open in a direction parallel to the direction in which the printed circuit board 50 extends. That is, the insertion hole 230 may be formed to allow the printed circuit board 50 to be inserted in a direction M2 parallel to the direction in which the printed circuit board 50 extends. In this case, the insertion hole 230 may be provided on the inclined surface 220. However, the present disclosure is not limited thereto, and the printed circuit board 50 may be mounted on the case 40 in various directions, and the insertion hole 230 may also be formed to correspond to the direction M2 through which the interference portion 130 of the mounting member 100 is inserted. For example, the printed circuit board 50 may be inserted in a direction M1 parallel to the direction in which the printed circuit board 50 and the board separation surface 40*a* face, and in this case, the insertion hole 230 may be formed in the direction M1 from the seating surface 210.

When the insertion hole 230 is provided in plurality because the board mounting portion 200 is provided in plurality or when the plurality of insertion holes 230 is formed in a single board mounting portion 200, the plurality of insertion holes 230 may be formed to be open in a constant direction. That is, the plurality of insertion holes 230 may be formed to allow the direction, in which the interference portion 130 of the plurality of mounting members 100 is inserted, to be constant. Accordingly, the interference portion 130 may be easily mounted in the insertion hole 230 or easily removed from the insertion hole 230. However, the present disclosure is not limited thereto, and the insertion hole 230 may be formed in various ways, and a single insertion hole 230 may be formed.

However, the shape of the board mounting portion 200 is not limited thereto, and may include various shapes in which the printed circuit board 50 is mountable by the mounting member 100. For example, the mounting member 100 coupled to the printed circuit board 50 may include a hole or a groove, and the board mounting portion 200 may include a protrusion provided to penetrate the hole or to be inserted into the groove of the mounting member 100. Accordingly, the printed circuit board 50 may be mounted on the board mounting portion 200 in a method in which the protrusion of the board mounting portion 200 interferes with the hole or the groove of the mounting member 100.

The board mounting portion 200 may be provided in plurality, as shown in FIGS. 3 to 5. However, the present disclosure is not limited thereto and the board mounting portion 200 may be provided in various numbers to allow the printed circuit board 50 to be stably mounted on the case 40. A single board mounting portion 200 may be provided.

With the above configuration, the printed circuit board 50 may move in the direction M1 from the position of FIG. 3 toward the case 40 as shown in FIG. 4, and then, as the printed circuit board 50 moves in the direction M2, the interference portion 130 (refer to FIG. 6) of the mounting member 100 coupled to the printed circuit board 50 may be inserted into the insertion hole 230 in the direction M2 and mounted on the board mounting portion 200. However, the method in which the printed circuit board 50 is mounted on the board mounting portion 200 by the mounting member 100 is not limited thereto.

The interference portion 130, which will be described later, may be provided to interfere with the interference wall 240 (refer to FIG. 11) of the board mounting portion 200 so as to allow the printed circuit board 50 to be mounted on the board mounting portion 200. Accordingly, the printed circuit board 50 may be removably mounted on the board mounting portion 200. For example, the interference portion 130 may be provided to be removable after being inserted into the board mounting portion 200 through the insertion hole 230, and thus the printed circuit board 50 may be removably mounted on the board mounting portion 200. However, the present disclosure is not limited thereto, and the printed circuit board 50 may be mounted to the board mounting portion 200 in a non-removable manner. Even when the electronic device 1 includes all of the above-described configurations, the printed circuit board 50 may be fixed to the board mounting portion 200 by a separate fixing member, and thus the printed circuit board 50 may be not removable from the board mounting portion 200.

The case 40 may include a board guide portion 201 provided to guide the movement of the printed circuit board 50, in addition to the board mounting portion 200. The board guide portion 201 may be formed to have a shape that protrudes from the board separation surface 40*a*. The board guide portion 201 may include a guide protrusion 201*a* having a protruding shape, and the printed circuit board 50 may be provided with a guide hole 54*a* formed in a position corresponding to a position of the guide protrusion 201*a* when the printed circuit board 50 is mounted on the case 40. The guide protrusion 201*a* may be inserted into the guide hole 54*a*.

The guide hole 54*a* may extend in the direction in which the printed circuit board 50 is mounted on the board mounting portion 200. For example, as shown in FIG. 5, the guide hole 54*a* may extend in a direction parallel to the direction M2 corresponding to a direction in which the printed circuit board 50 is mounted to the board mounting portion 200, that is, the direction in which the interference portion 130 is inserted into the insertion hole 230. The printed circuit board 50 may be guided to move in the direction, in which the printed circuit board 50 is mounted on the case 40, by the guide protrusion 201*a* inserted into the guide hole 54*a*. Further, even when the printed circuit board 50 is separated from the case 40, the printed circuit board 50 may be guided to move in a direction, in which the printed circuit board 50 is separated from the case 40, by the guide protrusion 201*a*.

As illustrated in FIGS. 3 to 5, the case 40 may include the board mounting portion 202, in which the insertion hole 230 provided to allow the interference portion 130 of the mounting member 100 to be inserted and the guide protrusion 201*a* provided to guide the movement of the printed circuit board 50 are provided. The guide protrusion 201*a* may be provided on the seating surface 210.

The guide protrusion 201*a* of the board mounting portion 202 may have a protruding shape to be inserted into the guide hole 54*b* formed in the printed circuit board 50. The guide protrusion 201*a* may be inserted into the guide hole 54*b* to guide the movement of the printed circuit board 50 to allow the printed circuit board 50 to be mounted on or to be separated from the case 40.

A stopper 201*b* formed in a protruding shape may be provided on the seating surface 210 of the board mounting portion 202 to prevent the printed circuit board 50 from being easily separated after being mounted at a predetermined position on the case 40.

The stopper 201*b* may be formed to protrude from the seating surface 210 of the board mounting portion 202, like the guide protrusion 201*a*, and may be formed to be inserted into the guide hole 54*b* of the printed circuit board 50. The stopper 201*b* may be inserted into the guide hole 54*b* to support one side of the guide hole 54*b*, and thus the printed circuit board 50 may be stably mounted on the case 40.

With the above configuration, the electronic device 1 may easily mount the printed circuit board 50, to which the mounting member 100 is coupled, to the case 40 by sliding the printed circuit board 50 against the board mounting portion 200 of the case 40. At this time, manufacturing time and manufacturing cost may be reduced in comparison with a method in which the printed circuit board 50 is directly fastened to the case 40, such as by fastening screws. In addition, even when it is required to separate the printed circuit board 50 from the case 40 for repair or replacement of the electronic component (p), the printed circuit board 50 coupled to the case 40 in the sliding manner may be more easily separated in comparison with the printed circuit board 50 coupled to the case 40 by the fastening screws.

However, the present disclosure is not limited thereto, and the case 40 may be configured to include various structures for mounting the printed circuit board 50 to the case 40. Unlike FIGS. 3 to 5, the case 40 may not be provided with the board guide portion 201, and the case 40 may not be provided with the board mounting portion 202 including the guide protrusion 202*a* and the stopper 202*b*.

Hereinafter for convenience of description, the board mounting portion 200 excluding the guide protrusion 202*a* and the stopper 202*b* will be described as an example. However, the following configurations may also be applied to the board mounting portion 200 including the guide protrusion 202*a* and the stopper 202*b*.

Figure 6:
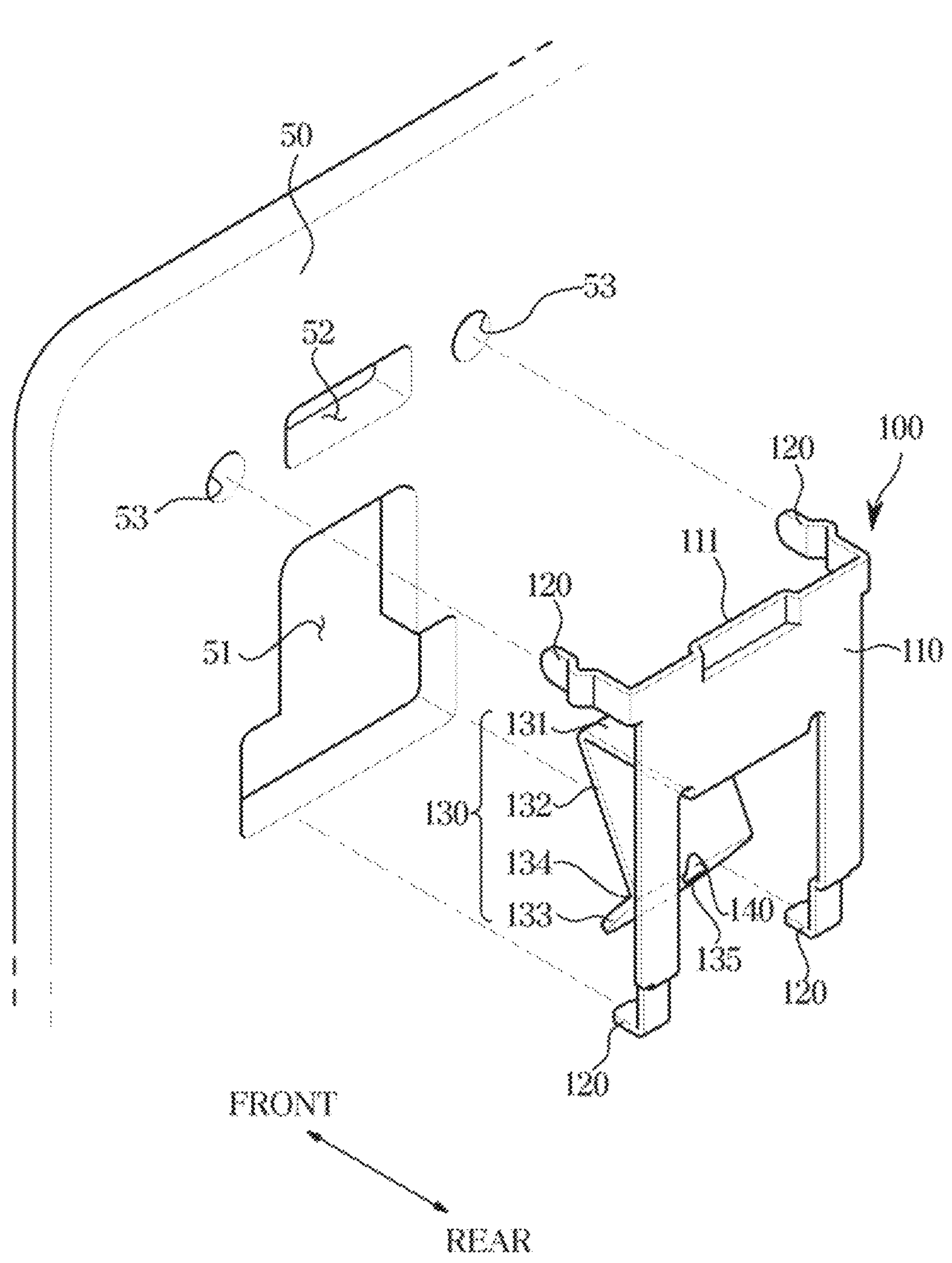
FIG. 6 is a view illustrating a coupling relationship between a mounting member and the printed circuit board in the electronic device some embodiments of the present disclosure.
Figure 7:
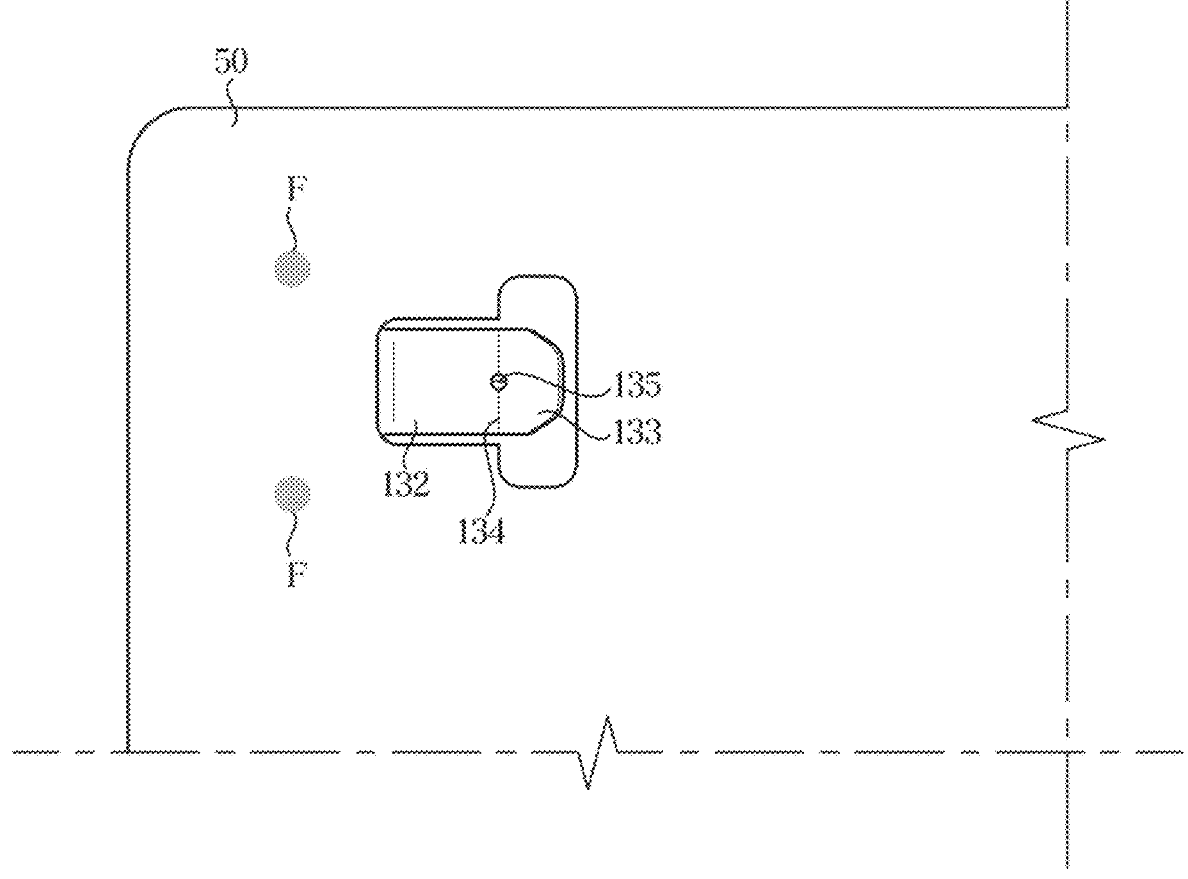
FIG. 7 is a view illustrating a state in which the mounting member is fixed to the printed circuit board in the electronic device some embodiments of the present disclosure.

FIG. 6 is a view illustrating a coupling relationship between a mounting member and the printed circuit board in the electronic device according to some embodiments of the present disclosure. FIG. 7 is a view illustrating a state in which the mounting member is fixed to the printed circuit board in the electronic device according to some embodiments of the present disclosure.

Referring to FIGS. 6 and 7, the electronic device 1 may include the mounting member 100, and the mounting member 100 may be coupled to the printed circuit board 50. The mounting member 100 may be fixed to the printed circuit board 50 so as to allow the printed circuit board 50 to be mounted on the board mounting portion 200. The mounting member 100 may be referred to as a mounting bracket 100. In other words, the electronic device 1 may include the mounting bracket 100, and the mounting bracket 100 may be provided to mount the printed circuit board 50, on which the electronic component P is mounted, to the case 40.

The mounting member 100 may include a mounting body 110 mounted on one surface of the printed circuit board 50. The mounting body 110 may be provided to allow the mounting member 100 to be supported by one surface of the printed circuit board 50. The mounting body 110 may be mounted on one surface of the printed circuit board 50 opposite to the board mounting portion 200, but is not limited thereto.

The mounting body 110 may be formed to have a flat plate shape. The mounting body 110 may be formed to have a shape parallel to the printed circuit board 50. The mounting body 110 may be seated in close contact with one surface of the printed circuit board 50. However, the present disclosure is not limited thereto, and the mounting body 110 may have various shapes provided to be seated on the printed circuit board 50.

The mounting body 110 may be referred to as a bracket body 110. That is, the mounting bracket 100 may include the bracket body 110 provided to be seated on one surface of the printed circuit board 50. The bracket body 110 may have a flat plate shape and may be formed to have a shape parallel to the printed circuit board 50. The bracket body 110 may be seated in close contact with one surface of the printed circuit board 50.

The mounting body 110 may include a support portion 111 concavely formed toward the printed circuit board 50 when the mounting member 100 is coupled to the printed circuit board 50. In the printed circuit board 50, a support hole 52 may be formed at a position corresponding to the position of the support portion 111 of the mounting body 110, and the support portion 111 may be inserted into the support hole 52 to be accommodated. As the support portion 111 is inserted into the support hole 52, the mounting member 100 may be more stably supported on the printed circuit board 50.

In other words, the bracket body 110 may include the support portion 111 provided to be inserted into and supported in the support hole 52, and the mounting bracket 100 may be more stably supported on the printed circuit board 50.

However, the present disclosure is not limited thereto, and the mounting body 110 may have various shapes. FIGS. 6 and 7 illustrate that the support portion 111 is formed at an end of the mounting body 110. However, the support portion 111 may be formed at another position of the mounting body 110. At this time, according to the position of the support portion 111, the support portion 111 may be inserted into another configuration of the printed circuit board 50 other than the support hole 52, for example, the board through-hole 51. Alternatively, the mounting body 110 may not include the support portion 111.

The mounting member 100 may include a fixing portion 120 provided to couple the mounting member 100 to the printed circuit board. The fixing portion 120 may extend from the mounting body 110 and be provided to fix the mounting member 100 to the printed circuit board 50.

The fixing portion 120 may extend from the mounting body 110 so as to penetrate the printed circuit board 50 or at least be inserted into the printed circuit board 50 when the mounting member 100 is coupled to the printed circuit board 50. When the mounting body 110 is seated on one surface of the printed circuit board 50 opposite to the board mounting portion 200, the fixing portion 120 may extend from the mounting body 110 toward the board mounting portion 200.

The fixing portion 120 may be provided in plurality. The plurality of fixing portions may be formed to be symmetrical to each other. In this case, the mounting member 100 may be more stably fixed to the printed circuit board 50. However, the present disclosure is not limited thereto, and a single fixing portion 120 may be provided.

At least a portion of the fixing portion 120 may be formed to penetrate a fixing hole 53 formed in the printed circuit board 50. The at least a portion of the fixing portion 120 penetrating the fixing hole 53 may be fixed to the printed circuit board 50 through soldering fixation F as shown in FIG. 7. However, the present disclosure is not limited thereto, and the fixing portion 120 may be fixed to the printed circuit board 50 in various ways.

At least a portion of the fixing portion 120 may extend toward the board through-hole 51 and may be supported on an inner surface of the board through-hole 51. However, the present disclosure is not limited thereto, and all of the fixing portions 120 may be supported on the printed circuit board 50 by passing through the fixing holes 53.

The fixing portion 120 may be referred to as a fixing pin 120. In other words, the mounting bracket 100 may include the fixing pin 120 provided to extend from the bracket body 110 and fixed to the printed circuit board 50. Accordingly, the mounting bracket 100 may be fixed to the printed circuit board 50. At least a portion of the fixing pin 120 may be formed to penetrate the fixing hole 53 and fixed to the printed circuit board 50 through the soldering fixation F.

That is, in a method of inserting the fixing portion 120 into the fixing hole 53 of the printed circuit board 50 and then fixing the fixing portion 120 to the printed circuit board 50 through the soldering fixation F, the mounting member 100 may be easily fixed to the printed circuit board 50, and the mounting member 100 may be stably coupled to the printed circuit board 50. In other words, in a method of inserting the fixing portion 120 into the fixing hole 53 of the printed circuit board 50 and then fixing the fixing portion 120 to the printed circuit board 50 through the soldering fixation F, the mounting bracket 100 may be easily fixed to the printed circuit board 50, and the mounting bracket 100 may be stably coupled to the printed circuit board 50.

The mounting member 100 may include the interference portion 130 provided to interfere with the board mounting portion 200. A configuration of the board mounting portion 200 provided to interfere with the interference portion 130 of the mounting member 100 may be referred to as the interference wall 240 (refer to FIG. 11).

In other words, the mounting bracket 100 may include the interference portion 130 provided to interfere with the interference wall 240 to couple the mounting bracket 100 to the case 40. The interference of the interference portion 130 with the interference wall 240 will be described later.

The interference portion 130 may extend from the mounting body 110. Particularly, the interference portion 130 may extend from the mounting body 110 toward the board mounting portion 200. In other words, the interference portion 130 may extend from the bracket body 110 toward the board mounting portion 200.

When the mounting body 110 is seated on one surface of the printed circuit board 50 opposite to the board mounting portion 200, the interference portion 130 may extend from the mounting body 110 to penetrate the printed circuit board 50. In other words, the interference portion 130 may extend from the bracket body 110 to penetrate the printed circuit board 50. At this time, the board through-hole 51 may be formed in the printed circuit board 50, and the interference portion 130 may penetrate the board through-hole 51.

In other words, the interference portion 130 may be disposed on one side of the printed circuit board 50 facing the board mounting portion 200, and the mounting body 110 may be disposed on the other side of the printed circuit board 50. In this case, the mounting member 100 may mount the printed circuit board 50 to the board mounting portion 200 so as to be in closer contact with the board mounting portion 200. Accordingly, a bonding force between the printed circuit board 50 and the board mounting portion 200 may be improved, and a gap between the printed circuit board 50 and the board mounting portion 200 may be reduced to achieve miniaturization of the electronic device 1. However, the present disclosure is not limited thereto, and when the mounting body 110 is seated on one surface of the printed circuit board 50 facing the board mounting portion 200, the interference portion 130 may not penetrate the printed circuit board 50.

The interference portion 130 may include extension portions 132 and 133 provided to interfere with the interference wall 240 and a connection portion 131 connecting the extension portions 132 and 133 and the mounting body 110. The connection portion 131 may extend from the mounting body 110, and the extension portions 132 and 133 may extend from the connection portion 131. The connection portion 131 may be provided to penetrate the board through-hole 51.

The extension portions 132 and 133 may be formed to be bent and extend from one end of the connection portion 131. The extension portions 132 and 133 may include a first extension portion 132 extending from one end of the connection portion 131 toward the mounting body 110, and a second extension portion 133 provided to be bent and extend from one end, which is opposite to the connection portion 131, of the first extension portion 132. A bending portion 134 having a bent shape may be disposed between the first extension portion 132 and the second extension portion 133.

In other words, when the printed circuit board 50 is mounted on the board mounting portion 200 by the mounting member 100, the interference portion 130 may include the first extension portion 132 extending toward the interference wall 240 (refer to FIG. 11), the bending portion 134 formed to be bent at one end, which faces the interference wall 240, of the first extension portion 132, and the second extension portion 133 extending from the bending portion 134.

The second extension portion 133 may extend from the bending portion 134 to a direction away from the mounting body 110. That is, when the printed circuit board 50 is mounted on the board mounting portion 200 by the mounting member 100, the second extension portion 133 may extend from the bending portion 134 to a direction away from the interference wall 240. In this case, among the first extension portion 132, the second extension portion 133, and the bending portion 134, the bending portion 134 may be closest to the mounting body 110. In other words, the bending portion 134 may be provided to be closest to the interference wall 240.

However, the above description of the configuration of the mounting member 100 is only an example of the mounting member 100 according to the present disclosure, and the configuration of the mounting member 100 is not limited thereto. The mounting member 100 may be configured in various ways as long as the mounting member 100 is fixed to the printed circuit board 50 so as to mount the printed circuit board 50 to the board mounting portion 200. That is, the mounting member 100 may have various shapes according to the shape of the board mounting portion 200 and the method of mounting the printed circuit board 50 to the board mounting portion 200.

For example, the mounting member 100 coupled to the printed circuit board 50 may include a hole or a groove, and the board mounting portion 200 may include a protrusion provided to penetrate the hole or provided to be inserted into the groove of the mounting member 100. Accordingly, in a method in which the protrusion of the board mounting portion 200 interferes with the hole or the groove of the mounting member 100, the printed circuit board 50 may be mounted on the board mounting portion 200. In this case, the hole or the groove of the mounting member 100 may perform the function of the interference portion 130, and the protrusion of the board mounting portion 200 may interfere with the hole or the groove of the mounting member 100 to perform the function of the interference wall 240 (refer to FIG. 11) described later.

Figure 8:
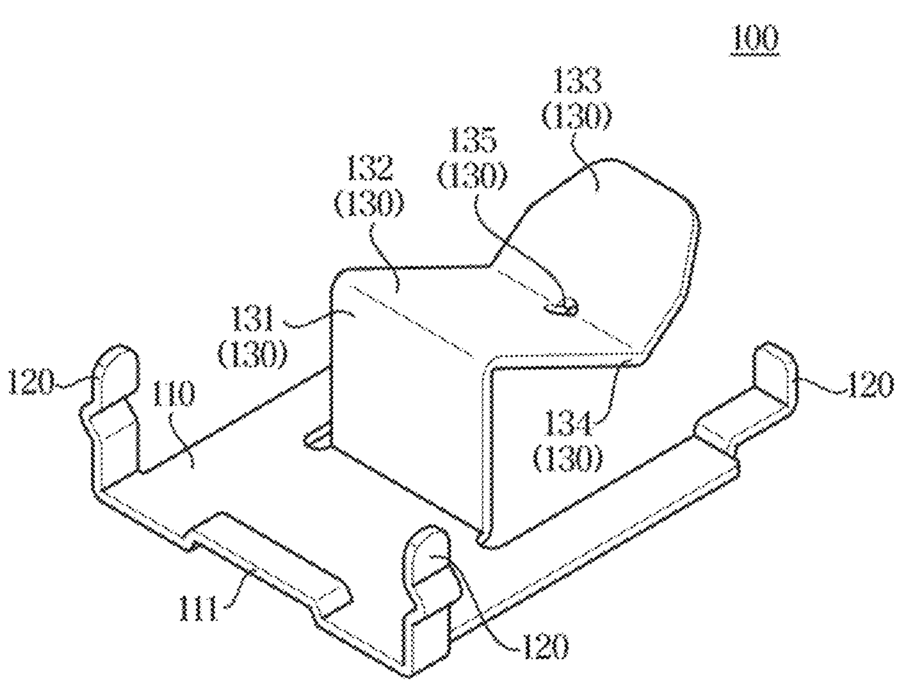
FIG. 8 is a view illustrating the mounting member of the electronic device some embodiments of the present disclosure.
Figure 9:
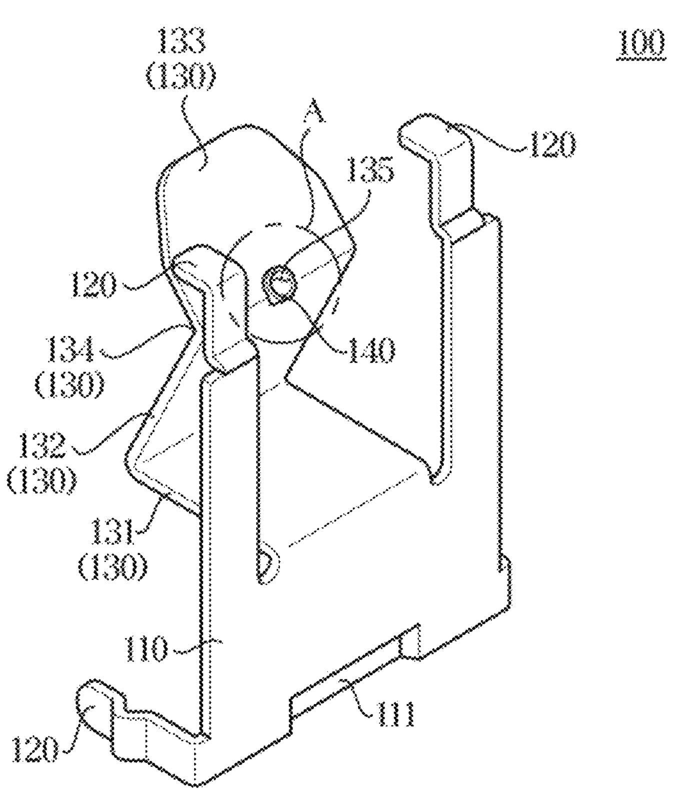
FIG. 9 is a view illustrating the mounting member of FIG. 8 when viewed from another direction some embodiments of the present disclosure.
Figure 10:
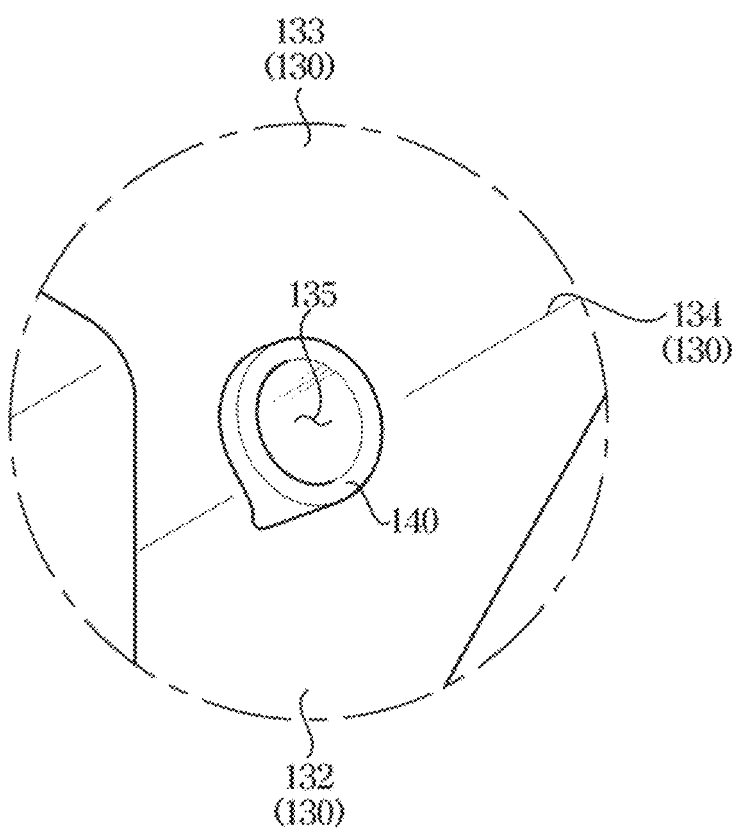
FIG. 10 is an enlarged view of A in FIG. 9.
Figure 11:
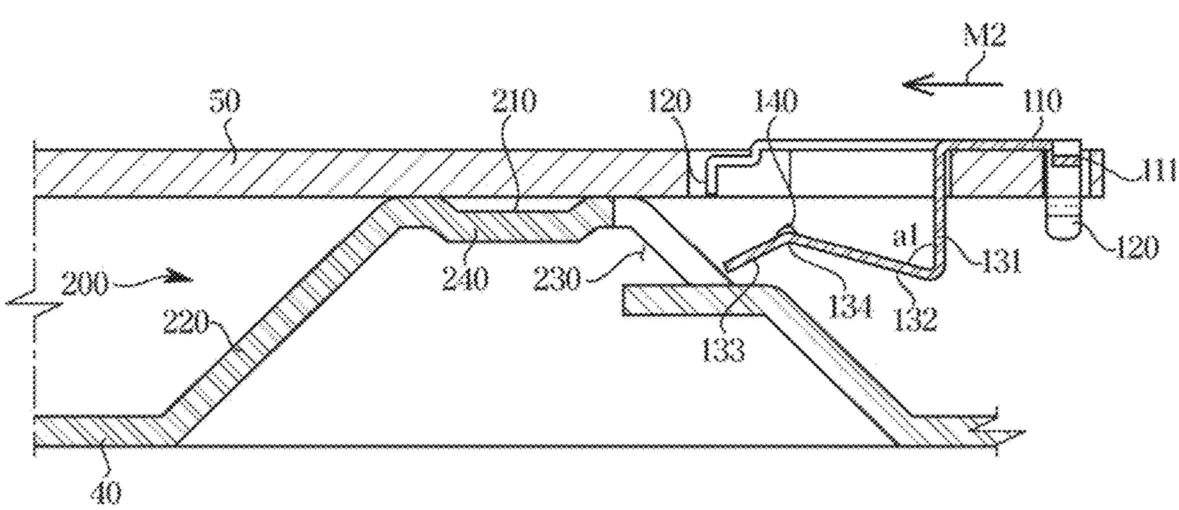
FIG. 11 is a cross-sectional view illustrating before the printed circuit board is mounted on the case in the electronic device some embodiments of the present disclosure.
Figure 11:
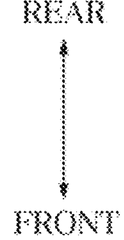
Figure 12:
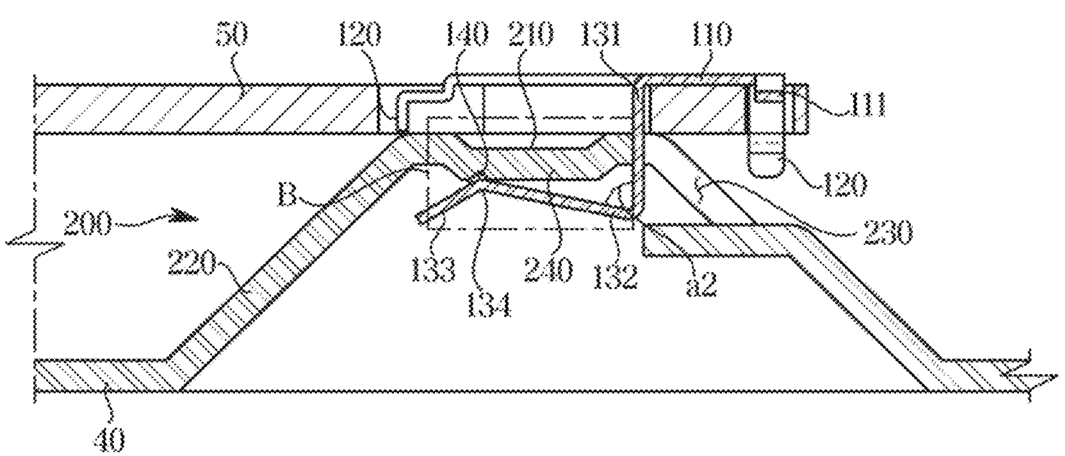
FIG. 12 is a cross-sectional view illustrating after the printed circuit board of FIG. 11 is mounted on the case some embodiments of the present disclosure.
Figure 12:
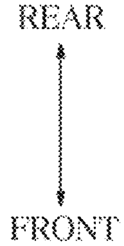
Figure 13:
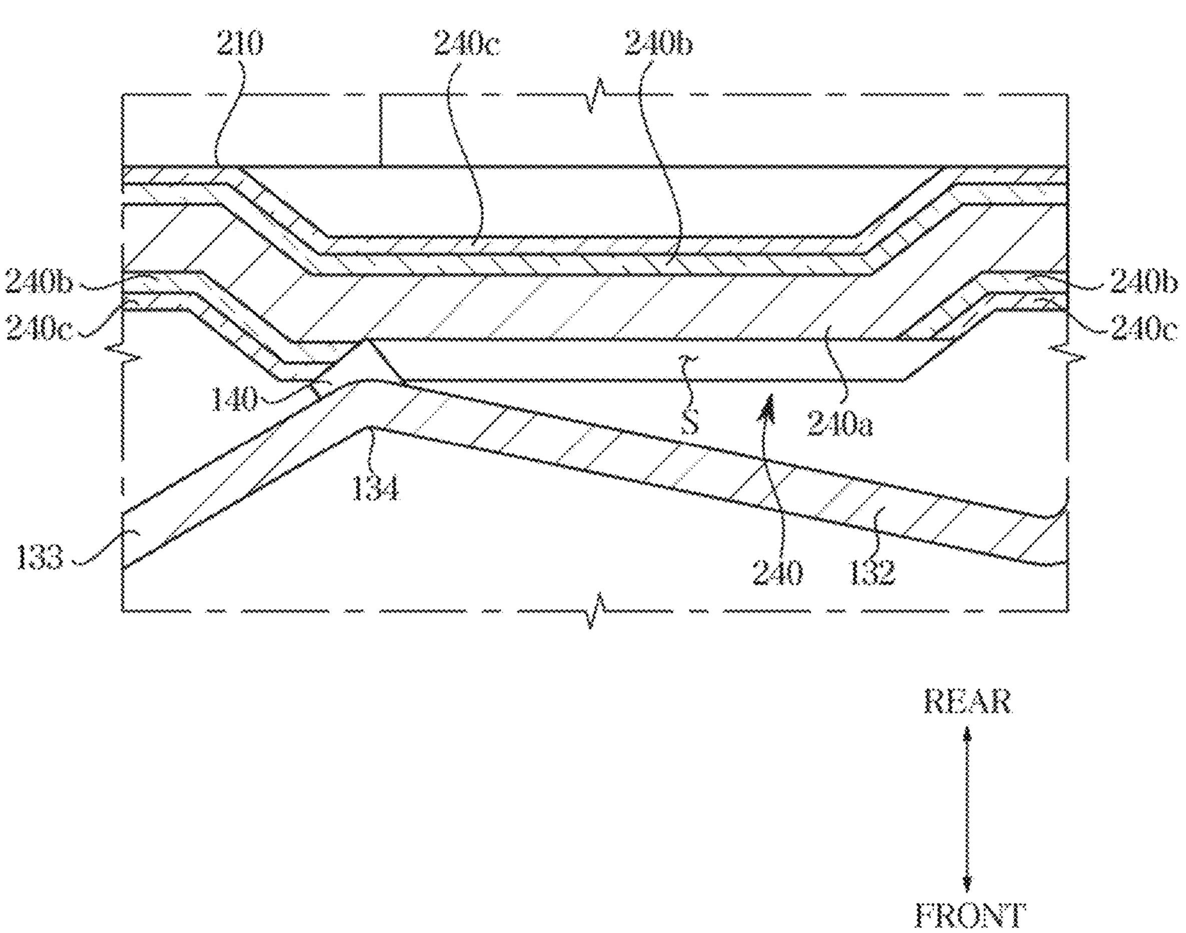
FIG. 13 is an enlarged view of B of FIG. 12.
Figure 14:
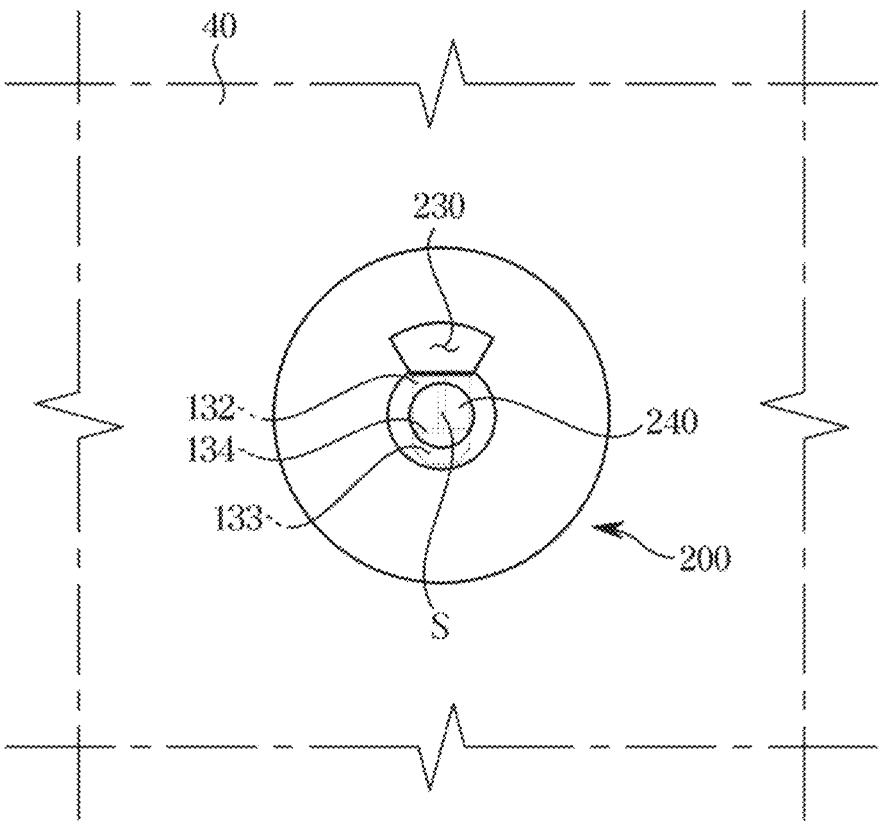
FIG. 14 is a view illustrating the printed circuit board mounted in the case of FIG. 12 when viewed from another direction some embodiments of the present disclosure.

FIG. 8 is a view illustrating the mounting member of the electronic device according to some embodiments of the present disclosure. FIG. 9 is a view illustrating the mounting member of FIG. 8 when viewed from another direction. FIG. 10 is an enlarged view of A in FIG. 9. FIG. 11 is a cross-sectional view illustrating before the printed circuit board is mounted on the case in the electronic device according to some embodiments of the present disclosure. FIG. 12 is a cross-sectional view illustrating after the printed circuit board of FIG. 11 is mounted on the case. FIG. 13 is an enlarged view of B of FIG. 12. FIG. 14 is a view illustrating the printed circuit board mounted in the case of FIG. 12 when viewed from another direction.

Referring to FIGS. 8 and 14, the printed circuit board 50, to which the mounting member 100 is coupled, may be mounted on the board mounting portion 200 by sliding and moving in the direction M2 as shown in FIGS. 4 and 5. In other words, the printed circuit board 50, to which the mounting bracket 100 is coupled, may be mounted on the board mounting portion 200 by sliding and moving in the direction M2.

The board mounting portion 200 may include the insertion hole 230, and the mounting member 100 may include the interference portion 130 inserted into the insertion hole 230. The interference portion 130 may be inserted into the interference wall 240 of the board mounting portion 200 through the insertion hole 230. The interference portion 130 may be inserted into the insertion hole 230 and then in contact with the interference wall 240, and may interfere with the interference wall 240 to mount the mounting member 100 and the printed circuit board 50 to the board mounting portion 200. At this time, a scratch protrusion 140, which will be described later, may also be inserted through the insertion hole 230 together with the interference portion 130, and the scratch protrusion 140 may be in contact with the interference wall 240.

The interference wall 240 may be formed parallel to the mounting body 110. Further, the interference wall 240 may be formed parallel to the printed circuit board 50. In this case, the interference portion 130 may interfere with the interference wall 240 while moving in the direction M2 parallel to the mounting body 110 and the printed circuit board 50. The printed circuit board 50 may be mounted on the board mounting portion 200 while sliding and moving in the direction M2. At this time, the scratch protrusion 140, which will be described later, may be also inserted into the insertion hole 230 in the direction M2 parallel to the direction, in which the printed circuit board 50 extends, and may be in contact with the interference wall 240.

The interference portion 130 may be provided in such a way that a distance between the bending portion 134 and the mounting body 110 when the interference portion 130 does not interfere with the interference wall 240 is less than a distance between the bending portion 134 and the mounting body 110 when the interference portion 130 interferes with the interference wall 240. In other words, as shown in FIGS. 11 and 12, the interference portion 130 may be provided in such a way that a gap between the connection portion 131 and the first extension portion 132 is increased when the interference portion 130 interferes with the interference wall 240. In other words, an angle a2 between the connection portion 131 and the first extension portion 132 when the interference portion 130 interferes with the interference wall 240 may be greater than an angle a1 between the connection portion 131 and the first extension portion 132 when the interference portion 130 does not interfere with the interference wall 240. Accordingly, when the interference portion 130 interferes with the interference wall 240, the bending portion 134 may press the interference wall 240, and the printed circuit board 50 may be stably mounted on the board mounting portion 200.

As described later, the scratch protrusion 140 may be formed to protrude from the bending portion 134 toward the interference wall 240. At this time, a distance between the scratch protrusion 140 and the mounting body 110 when the interference portion 130 does not interfere with the interference wall 240 may be less than a distance between the scratch protrusion 140 and the mounting body 110 when the interference portion 130 interferes with the interference wall 240.

The interference portion 130 may be formed to include an elastic material. For example, the interference portion 130 may be formed to include an elastic metal material. Accordingly, the interference portion 130 may be elastically deformed and easily interfere with the interference wall 240.

As described above, the interference portion 130 may include the first extension portion 132 extending toward the interference wall 240, the bending portion 134 being bent at one end, which faces the interference wall 240, of the first extension portion 132, and the second extension portion 133 extending from the bending portion 134. The second extension portion 133 may extend from the bending portion 134 to a direction away from the interference wall 240.

Accordingly, even when the mounting body 110 is not in sufficiently close contact with the printed circuit board 50 or the printed circuit board 50 is not in sufficiently close contact with the seating surface 210, the second extension portion 133 may serve as a guide to allow the interference portion 130 to be easily inserted into the insertion hole 230. However, the present disclosure is not limited thereto, and the interference portion 130 and the second extension portion 133 of the interference portion 130 may have various shapes. For example, the second extension portion 133 may be bent and extend from the first extension portion 132, and may also extend in a direction parallel to the interference wall 240.

The interference wall 240 may include a conductive layer **240*a* formed to include a conductive material and coating layers 240*b* and 240*c* applied to an outer surface of the interference wall 240**.

The conductive material included in the conductive layer **240*a* may include a conductive metal material such as iron (Fe). The coating layers 240*b* and 240*c* may be applied to the outside of the conductive layer 240*a* to prevent the corrosion of the conductive layer 240*a***.

The coating layers **240*b* and 240*c* may include a plurality of coating layers 240*b* and 240*c* as shown in FIG. 13, and particularly, include a first coating layer 240*b* and a second coating layer 240*c* applied to the outside of the first coating layer 240*b***.

The first coating layer **240*b* and the second coating layer 240*c* may include various materials provided to prevent the corrosion of the conductive layer 240*a*. For example, the first coating layer 240*b* may be a zinc (Zn) plating layer, and the second coating layer 240*c*** may be a layer for anti-fingerprint coating, for example, an acrylate coating layer.

However, the present disclosure is not limited thereto, and the type of material forming the coating layers **240*b* and 240*c* is not limited thereto. The coating layers 240*b* and 240*c* do not necessarily have to function to prevent the corrosion of the conductive layer 240*a*, and may be applied to the outer surface of the interference wall 240 for various purposes. In addition, the coating layers 240*b* and 240*c* do not necessarily have to be provided as a plurality of distinct layers, and the first coating layer 240*b* and the second coating layer 240*b*** may be a single layer of the same type as a whole.

When the electronic device 1 performs the function, electromagnetic waves may be generated from the electronic device 1, and the electromagnetic waves may be radiated to other surrounding devices and act as noise that affects the operation of surrounding devices. In other words, it may cause electromagnetic interference (EMI). Further, the electromagnetic waves may affect the human body, and thus there are international regulations to prevent the damage.

Particularly, as shown in FIG. 2, the electronic device 1 may include the plurality of printed circuit boards 50 mounted on the case 40, and it may be required that the plurality of printed circuit boards 50 form a common ground through the case, to reduce the noise caused by electromagnetic waves. Therefore, it is important to improve an extent to which the printed circuit board 50 is grounded through the case 40.

In order to allow the printed circuit board 50 to be grounded to the case 40, the board mounting portion 200 and the mounting member 100 may be provided to include a conductive material. Further, the case 40 may be integrally formed including the board mounting portion 200, and the case 40 may be provided to include a conductive material as a whole. The conductive materials that may be included in the board mounting portion 200 or the mounting member 100 may include conductive metal materials such as iron (Fe). Accordingly, the printed circuit board 50 may be grounded to the board mounting portion 200 through the mounting member 100. In other words, the board mounting portion 200 and the mounting bracket 100 may be provided to include a conductive material, and the printed circuit board 50 may be grounded to the board mounting portion 200 through the mounting bracket 100.

However, when the printed circuit board 50 is mounted on the board mounting portion 200, the interference portion 130 may not be sufficiently in contact with the interference wall 240, and accordingly, the printed circuit board 50 may not be sufficiently grounded to the case 40. Further, the extent to which the interference portion 130 is in contact with the interference wall 240 may not be uniform, and thus a deviation may occur in the extent to which the printed circuit board 50 is grounded to the case 40.

Further, as described above, the interference wall 240 may include the coating layers 240*b* and 240*c* applied to the outer surface thereof, and the coating layers 240*b* and 240*c* may be provided to include a non-conductive material. Therefore, even when the interference portion 130 of the mounting member 100 is in contact with the interference wall 240, the printed circuit board 50 may not be sufficiently grounded to the case 40 due to the coating layers 240*b* and 240*c*.

To relieve the difficulty, the mounting member 100 may include the scratch protrusion 140 protruding from the interference portion 130. In other words, the mounting bracket 100 may include the scratch protrusion 140 protruding from the interference portion 130.

The scratch protrusion 140 may be formed to protrude from the interference portion 130 toward the interference wall 240 when the printed circuit board 50 is mounted on the board mounting portion 200. The scratch protrusion 140 may be provided to be in contact with the interference wall 240 and may be provided to scratch the outer surface of the interference wall 240 when the interference portion 130 interferes with the interference wall 240.

Particularly, when the interference portion 130 moves in the direction M2 and is inserted into the insertion hole 230, the scratch protrusion 140 may also move along with the interference portion 130 in the direction M2 and be inserted into the insertion hole 230. When the interference portion 130 interferes with the interference wall 240, the scratch protrusion 140 may also interfere with the interference wall 240. In other words, the interference portion 130 may slide in a direction parallel to the direction, in which the printed circuit board 50 extends, and interfere with the interference wall 240 to allow the printed circuit board 50 to be mounted on the case 40. At this time, the scratch protrusion 140 may also slide relative to the interference wall 240 in the same direction.

The scratch protrusion 140 may penetrate the coating layers 240*b* and 240*c* when the interference portion 130 interferes with the interference wall 240. At this time, the scratch protrusion 140 may penetrate the coating layers 240*b* and 240*c* and be in contact with an inner side of the coating layers 240*b* and 240*c* of the interference wall 240. That is, the scratch protrusion 140 may penetrate the coating layers 240*b* and 240*c* and be in contact with the conductive layer 240*a*.

At least a portion of the coating layers 240*b* and 240*c* may be removed by the scratch protrusion 140 when the interference portion 130 interferes with the interference wall 240. In other words, when the scratch protrusion 140 slides and moves with respect to the interference wall 240, at least a portion of the coating layers 240*b* and 240*c* may be removed, and a scratch S through which the conductive layer 240*a* is exposed to the outside may be formed on the outer surface of the interference wall 240. The scratch S may be formed along a direction in which the scratch protrusion 140 moves on the interference wall 240.

With this configuration, the coating layers 240*b* and 240*c* of the interference wall 240 may be removed by the scratch protrusion 140, and the extent, to which the printed circuit board 50 is grounded to the board mounting portion 200 through the mounting member 100, may be increased. Further, the extent to which the mounting member 100 is coupled to the interference wall 240 may be improved by the scratch protrusion 140. In other words, because the mounting bracket 100 includes the scratch protrusion 140, the extent to which the mounting bracket 100 is coupled to the interference wall 240, and the extent to which the printed circuit board 50 is grounded to the board mounting portion 200 may be improved.

In addition, the scratch protrusion 140 may form the scratch S by selectively removing the coating layers 240*b* and 240*c* from a portion, which is in contact with the scratch protrusion 140, on one surface of the interference wall 240 that interferes with the interference portion 130 and the scratch protrusion 140. Accordingly, the remaining coating layers 240*b* and 240*c* that are not removed may prevent the conductive layer 240*a* from being damaged by the corrosion or the like.

Hereinafter the shape of the scratch protrusion 140 will be described in more detail.

The scratch protrusion 140 may be formed to protrude from the interference portion 130 so as to be contact with the interference wall 240. Particularly, the scratch protrusion 140 may be disposed between the first extension portion 132 and the second extension portion 133. In other words, the scratch protrusion 140 may be disposed on the bending portion 134 and may be formed to protrude from the bending portion 134 toward the interference wall 240. However, the present disclosure is not limited thereto, and the scratch protrusion 140 may be formed in various ways as long as the scratch protrusion 140 protrudes from the interference portion 130 and be in contact with the interference wall 240.

The interference portion 130 may include a through-hole 135 formed to face the interference wall 240. The through-hole 135 may be formed in the bending portion 134. At this time, the scratch protrusion 140 may be formed in a circumference of the through-hole 135. Particularly, the scratch protrusion 140 may be formed along the circumference of the through-hole 135 and may have a shape in which an inner side is penetrated along a direction of protruding from the interference portion 130. In other words, the scratch protrusion 140 may include a hollow that is penetrated in a direction facing the interference wall 240. The hollow of the scratch protrusion 140 may extend from the through-hole 135 toward the interference wall 240. In other words, the scratch protrusion 140 may be formed to include a shape similar to a hollow cylinder shape.

An inner surface of the scratch protrusion 140 may be formed integrally with an outer circumference of the through-hole 135. That is, the scratch protrusion 140 may be formed along the outer circumference of the through-hole 135, and the inner surface of the scratch protrusion 140 may be formed to protrude from the outer circumference of the through-hole 135 toward the interference wall 240.

Further, the scratch protrusion 140 may be formed integrally with the interference portion 130. However, the present disclosure is not limited thereto, and the scratch protrusion 140 may be formed separately from the interference portion 130 and then coupled to the interference portion 130.

When the printed circuit board 50 is disposed at the rear side of the bottom chassis 40 as illustrated in FIG. 2, the scratch protrusion 140 may protrude from the front side to the rear side of the bottom chassis 40. However, the present disclosure is not limited thereto, and the scratch protrusion 140 may be formed in various ways according to the arrangement relationship between the printed circuit board 50 and the bottom chassis 40 and the method in which the printed circuit board 50 is mounted on the bottom chassis 40.

With the above configuration, because the mounting member 100 includes the scratch protrusion 140 provided to scratch the outer wall of the interference wall 240 when the interference portion 130 interferes with the interference wall 240, the bonding force or contact force between the mounting member 100 and the interference wall 240 may be improved, and the extent, to which the printed circuit board 50 is grounded to the case 40, may be improved. In other words, because the mounting bracket 100 includes the scratch protrusion 140 provided to scratch the outer wall of the interference wall 240 when the interference portion 130 interferes with the interference wall 240, the bonding force or contact force between the mounting bracket 100 and the interference wall 240 may be improved, and the extent, to which the printed circuit board 50 is grounded to the case 40, may be improved.

However, the configuration of the scratch protrusion 140 is not limited thereto, and the scratch protrusion 140 may include various configurations provided to protrude from the interference portion 130 and provided to scratch the outer surface of the interference wall 240 of the board mounting portion 200.

Figure 15:
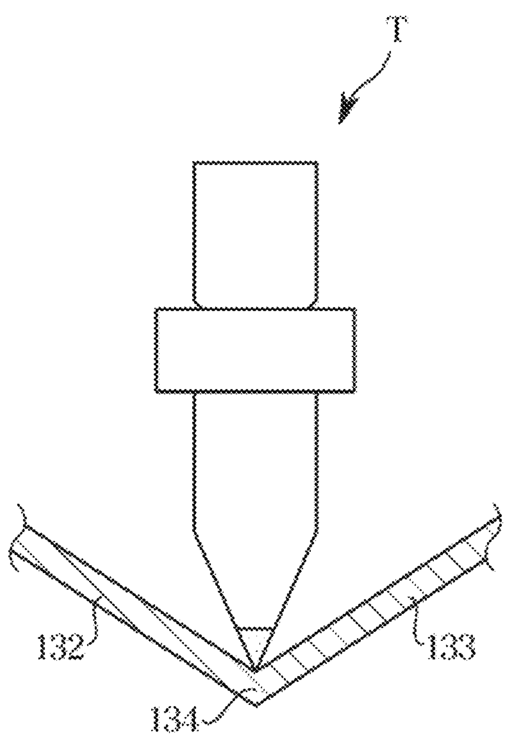
FIGS. 15 and 16 are views briefly illustrating a process of forming a scratch protrusion of the electronic device some embodiments of the present disclosure.
Figure 16:
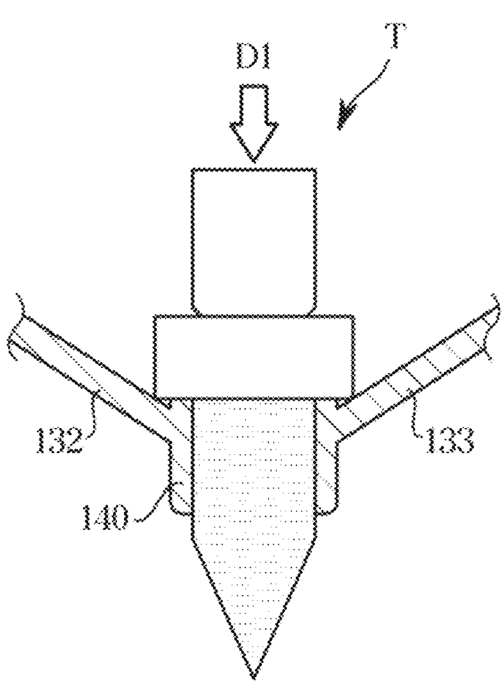

FIGS. 15 and 16 are views briefly illustrating a process of forming a scratch protrusion of the electronic device according to some embodiments of the present disclosure.

Referring to FIGS. 15 and 16, the scratch protrusion 140 may be manufactured in a method in which a portion of the interference portion 130 is pressed to be penetrated by using a tool T with a sharp tip. That is, the scratch protrusion 140 may be manufactured through burring processing.

As illustrated in FIG. 15, the tool T for manufacturing the scratch protrusion 140 may be positioned between the first extension portion 132 and the second extension portion 133. That is, the tool T may be positioned on the bending portion 134 prior to manufacturing the scratch protrusion 140.

The tip of the tool T may be located on one surface of the bending portion 134 and penetrate the bending portion 134 while moving in a direction D1 as shown in FIG. 16. One surface of the bending portion 134 may refer to one surface opposite to the interference wall 240 when the interference portion 130 interferes with the interference wall 240 in a direction opposite to the direction in which the scratch protrusion 140 protrudes from the interference portion 130. That is, the direction D1, which is a moving direction of the tool T, may be parallel to a direction in which the scratch protrusion 140 protrudes from the interference portion 130.

When the tool T penetrates the bending portion 134 while moving in the direction D1, the through-hole 135 may be formed in the bending portion 134. At the same time, at least a portion of the bending portion 134 may be pressed by the tool T and bent in the direction D1 to protrude. That is, the scratch protrusion 140 may be formed in such a way that at least a portion of the bending portion 134 is pressed to form the through-hole 135 and protrudes by being bent in the direction D1 at the position, in which the through-hole 135 is formed.

Through this process, the scratch protrusion 140 may be formed to protrude in the direction D1, in which the interference portion 130 is pressed, when the through-hole 135 is formed by the interference portion 130. The scratch protrusion 140 may be formed to protrude in the direction D1 (e.g. a pressing direction of the interference portion 130) when through hole is pressed.

However, unlike FIGS. 15 and 16, the scratch protrusion 140 may be formed to protrude from a position other than the bending portion 134 of the interference portion 130, and the through-hole 135 may be formed to protrude from a position in the interference portion 130 other than the bending portion 134. In this case, the tool T may press a position in the interference portion 130 other than the bending portion 134 to penetrate the interference portion 130 and form the scratch protrusion 140.

A shape and size of the scratch protrusion 140 may vary according to the type of tool T, a moving distance of the tool T, and an intensity of pressure of the interference portion 130. This is also applied to the through-hole 135 formed in the interference portion 130.

When manufacturing the scratch protrusion 140 through the above-mentioned method, it is possible to reduce material costs and processing time in comparison with the method in which the scratch protrusion 140 is manufactured separately and coupled to the interference portion 130.

However, the description described in FIGS. 15 and 16 is only an example of the method for manufacturing the scratch protrusion 140 in the mounting member 100 of the electronic device 1 according to the present disclosure, and the scratch protrusion 140 may be manufactured in various methods.

Figure 17:
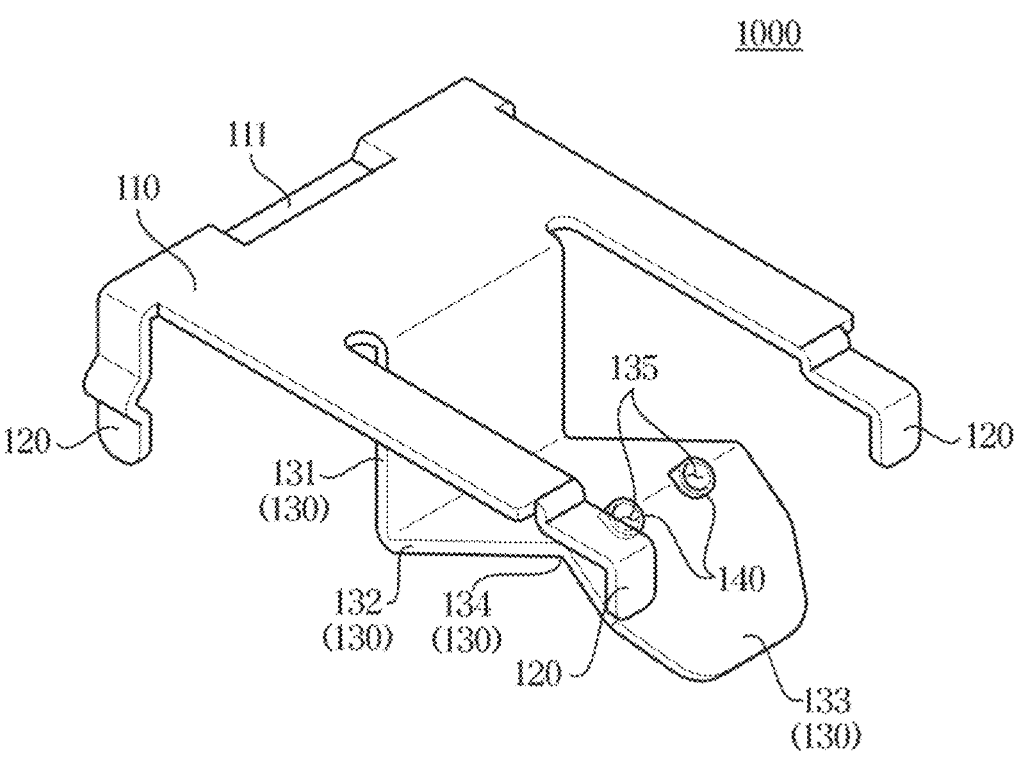
FIG. 17 is a view illustrating a mounting member of an electronic device some embodiments of the present disclosure.
Figure 18:
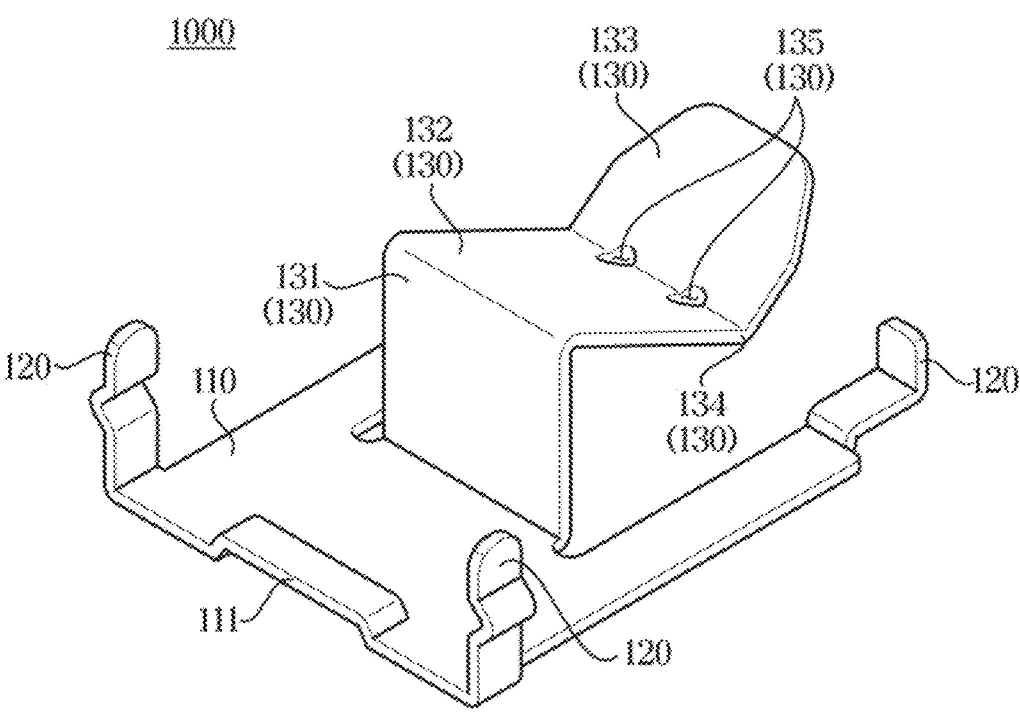
FIG. 18 is a view illustrating the mounting member of FIG. 17 when viewed from another direction according to some embodiments of the present disclosure.

FIG. 17 is a view illustrating a mounting member of an electronic device according to some embodiments of the present disclosure. FIG. 18 is a view illustrating the mounting member of FIG. 17 when viewed from another direction.

Referring to FIGS. 17 and 18, a mounting member of an electronic device according to some embodiments of the present disclosure will be described. In describing the embodiment shown in FIGS. 17 and 18, the same components as those shown in FIGS. 1 to 16 may be assigned the same reference numerals and a description thereof may be omitted.

Referring to FIGS. 17 and 18, a mounting member 1000 may include a plurality of scratch protrusions 140. In other words, the mounting bracket 1000 may include the plurality of scratch protrusions 140.

The plurality of scratch protrusions 140 may each be formed to protrude from the interference portion 130. Particularly, the plurality of scratch protrusions 140 may be formed to protrude from the bending portion 134, respectively. However, the present disclosure is not limited thereto, and the plurality of scratch protrusions 140 may be formed in various ways. For example, at least a portion of the scratch protrusions 140 may protrude from the bending portion 134, and at least other portions of the scratch protrusions 140 may protrude from other positions of the interference portion 130.

The plurality of scratch protrusions 140 may be arranged to be spaced apart from each other. However, the present disclosure is not limited thereto, and the plurality of scratch protrusions 140 may be arranged to be in contact with each other.

The plurality of scratch protrusions 140 may be provided to scratch the outer surface of the interference wall 240 when the interference portion 130 is in contact with the interference wall 240. The plurality of scratch protrusions 140 may penetrate the coating layers 240*b* and 240*c*, respectively, and may be in contact with the conductive layer 240*a* by removing the coating layers 240*b* and 240*c* applied to the outer surface of the interference wall 240, respectively. In other words, the plurality of scratch protrusions 140 may each form the scratch S, thereby forming a plurality of scratches S on the interference wall 240. However, the present disclosure is not limited thereto, and when the plurality of scratch protrusions 140 is arranged to be in contact with each other, the plurality of scratch protrusions 140 may slide with respect to the interference wall 240 and form one large scratch S.

The plurality of scratch protrusions 140 may be manufactured by burring processing as shown in FIGS. 15 and 16, respectively. However, the present disclosure is not limited thereto, and the plurality of scratch protrusions 140 may be manufactured using various methods.

FIGS. 17 and 18 illustrate that the mounting member 1000 includes two scratch protrusions 140, but is not limited thereto. Alternatively, the mounting member 1000 may include three or more scratch protrusions 140. The number of scratch protrusions 140 provided on the mounting member 1000 may be selected in various ways. The extent to which the printed circuit board 50 is coupled to the board mounting portion 200 by the mounting member 1000, and the extent to which the printed circuit board 50 is grounded to the board mounting portion 200 by the mounting member 1000 may vary according to the number of scratch protrusions 140. In other words, the number of scratch protrusions 140 formed on the mounting bracket 1000 may be selected in various ways, and accordingly, the extent to which the printed circuit board 50 is coupled to the board mounting portion 200 and the extent to which the printed circuit board 50 is grounded to the board mounting portion 200 may vary.

While example embodiments of the disclosure have been shown and described, the disclosure is not limited to the aforementioned specific embodiments, and it is to be understood that various modifications may be made by those having ordinary skill in the technical field to which the disclosure belongs, without departing from the gist of the disclosure as claimed by the appended claims. Further, it is intended that such modifications are not to be interpreted independently from the technical idea or prospect of the disclosure.

What is claimed is:

1. An electronic device comprising:

a printed circuit board on which an electronic component is mounted;

a case comprising a board mounting portion on which the printed circuit board is mounted, the board mounting portion comprising an interference wall; and a mounting member fixed to the printed circuit board and configured to fix the printed circuit board to the board mounting portion, the mounting member comprising an interference portion configured to interfere with the interference wall and a scratch protrusion protruding from the interference portion and configured to scratch an outer surface of the interference wall in a state in which the interference portion interferes with the interference wall, wherein the interference portion comprises a through-hole facing the interference wall, wherein the scratch protrusion has a circumference corresponding to a circumference of the through-hole, wherein the interference wall comprises a coating layer on the outer surface of the interference wall, and wherein the scratch protrusion is configured to remove at least a portion of the coating layer in a state in which the interference portion interferes with the interference wall.

2. The electronic device of claim 1, wherein the scratch protrusion is configured to penetrate the coating layer.

3. The electronic device of claim 2, wherein the interference wall further comprises a conductive layer covered by coating layer, and wherein the stratch protrusion is configured to contact the conductive layer.

4. The electronic device of claim 1, wherein the board mounting portion comprises an insertion hole into which the interference portion and the scratch protrusion are inserted, and wherein the scratch protrusion is configured to be inserted into the insertion hole and contact with the interference wall.

5. The electronic device of claim 4, wherein the insertion hole is open in a direction parallel to a direction in which the printed circuit board extends, and the scratch protrusion is configured to be inserted into the insertion hole in the direction parallel to the direction in which the printed circuit board extends.

6. The electronic device of claim 1, wherein the interference portion comprises:

a first extension portion extending toward the interference wall;

a bending portion bent at one end of the first extension portion facing the interference wall; and a second extension portion extending from the bending portion, and wherein the scratch protrusion is at the bending portion.

7. The electronic device of claim 6, wherein the second extension portion extends from the bending portion away from the interference wall.

8. The electronic device of claim 1, wherein the mounting member comprises:

a mounting body mounted on one surface of the printed circuit board; and a fixing portion extending from the mounting body and configured to couple the mounting member to the printed circuit board, and wherein the interference portion extends from the mounting body and is configured to penetrate the printed circuit board.

9. The electronic device of claim 8, wherein the interference wall is parallel to the mounting body, and wherein a distance between the scratch protrusion and the mounting body in a state in which the interference portion does not interfere with the interference wall is less than a distance between the scratch protrusion and the mounting body in a state in which the interference portion interferes with the interference wall.

10. The electronic device of claim 1, wherein an inner surface of the scratch protrusion is formed integrally with an outer circumference of the through-hole.

11. The electronic device of claim 1, wherein the scratch protrusion is formed to protrude in a pressing direction of the interference portion when the through-hole is pressed.

12. The electronic device of claim 1, wherein the interference portion comprises an elastic material.

13. The electronic device of claim 1, wherein the board mounting portion and the mounting member each comprise a conductive material.

* * * * *